(12) United States Patent
Sakurada

(10) Patent No.: US 10,210,042 B2
(45) Date of Patent: Feb. 19, 2019

(54) MEMORY SYSTEM

(71) Applicant: TOSHIBA MEMORY CORPORATION, Minato-ku (JP)

(72) Inventor: Kenji Sakurada, Yamato (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/455,967

(22) Filed: Mar. 10, 2017

(65) Prior Publication Data

US 2018/0074894 A1 Mar. 15, 2018

Related U.S. Application Data

(60) Provisional application No. 62/394,318, filed on Sep. 14, 2016.

(51) Int. Cl.
| | |
|---|---|
| G06F 11/10 | (2006.01) |
| G11C 16/26 | (2006.01) |
| G11C 16/10 | (2006.01) |
| G11C 16/34 | (2006.01) |
| G11C 29/52 | (2006.01) |
| G06F 3/06 | (2006.01) |
| G11C 11/56 | (2006.01) |

(Continued)

(52) U.S. Cl.
CPC ......... *G06F 11/1068* (2013.01); *G06F 3/064* (2013.01); *G06F 3/0619* (2013.01); *G06F 3/0655* (2013.01); *G06F 3/0679* (2013.01); *G11C 11/5642* (2013.01); *G11C 16/10* (2013.01); *G11C 16/26* (2013.01); *G11C 16/3427* (2013.01); *G11C 29/52* (2013.01);

*G11C 29/021* (2013.01); *G11C 29/028* (2013.01); *G11C 2029/0411* (2013.01)

(58) Field of Classification Search
CPC .................................................. G06F 11/1076
USPC ........................................ 714/764, 767, 770
See application file for complete search history.

(56) References Cited

U.S. PATENT DOCUMENTS

| | | | | |
|---|---|---|---|---|
| 3,967,176 A | * | 6/1976 | Wagener | B24B 49/18 318/603 |
| 5,418,446 A | * | 5/1995 | Hallidy | H02K 19/28 322/28 |
| 9,558,838 B2 | * | 1/2017 | Tanabe | G11C 16/0475 |

(Continued)

FOREIGN PATENT DOCUMENTS

| | | |
|---|---|---|
| JP | 2007-323731 | 12/2007 |
| JP | 2011-40137 | 2/2011 |

(Continued)

*Primary Examiner* — Fritz Alphonse
(74) *Attorney, Agent, or Firm* — Oblon, McClelland, Maier & Neustadt, L.L.P.

(57) ABSTRACT

According to one embodiment, a memory system includes a decoder configured to correct an error of the data stored in a memory based on result of the first read and the second read, and output a first signal of a first value indicating corrected data and a second signal of a second value indicating corrected data; a generator configured to count the first and second signals for first data items based on the result of the first and second read for generating count numbers of the first and second signals for each of the first data items; and a controller configured to compare a magnitude relation of the count numbers in order of read levels, determine the first data item when the magnitude relation changes.

20 Claims, 28 Drawing Sheets

(51) Int. Cl.
G11C 29/02 (2006.01)
G11C 29/04 (2006.01)

(56) References Cited

U.S. PATENT DOCUMENTS

2007/0279982 A1 12/2007 Shibata et al.
2011/0038212 A1 2/2011 Uchikawa et al.
2013/0077400 A1 3/2013 Sakurada
2014/0223263 A1 8/2014 Sakurada et al.

FOREIGN PATENT DOCUMENTS

| JP | 2012-38418 | 2/2012 |
| JP | 2013-80450 | 5/2013 |

* cited by examiner

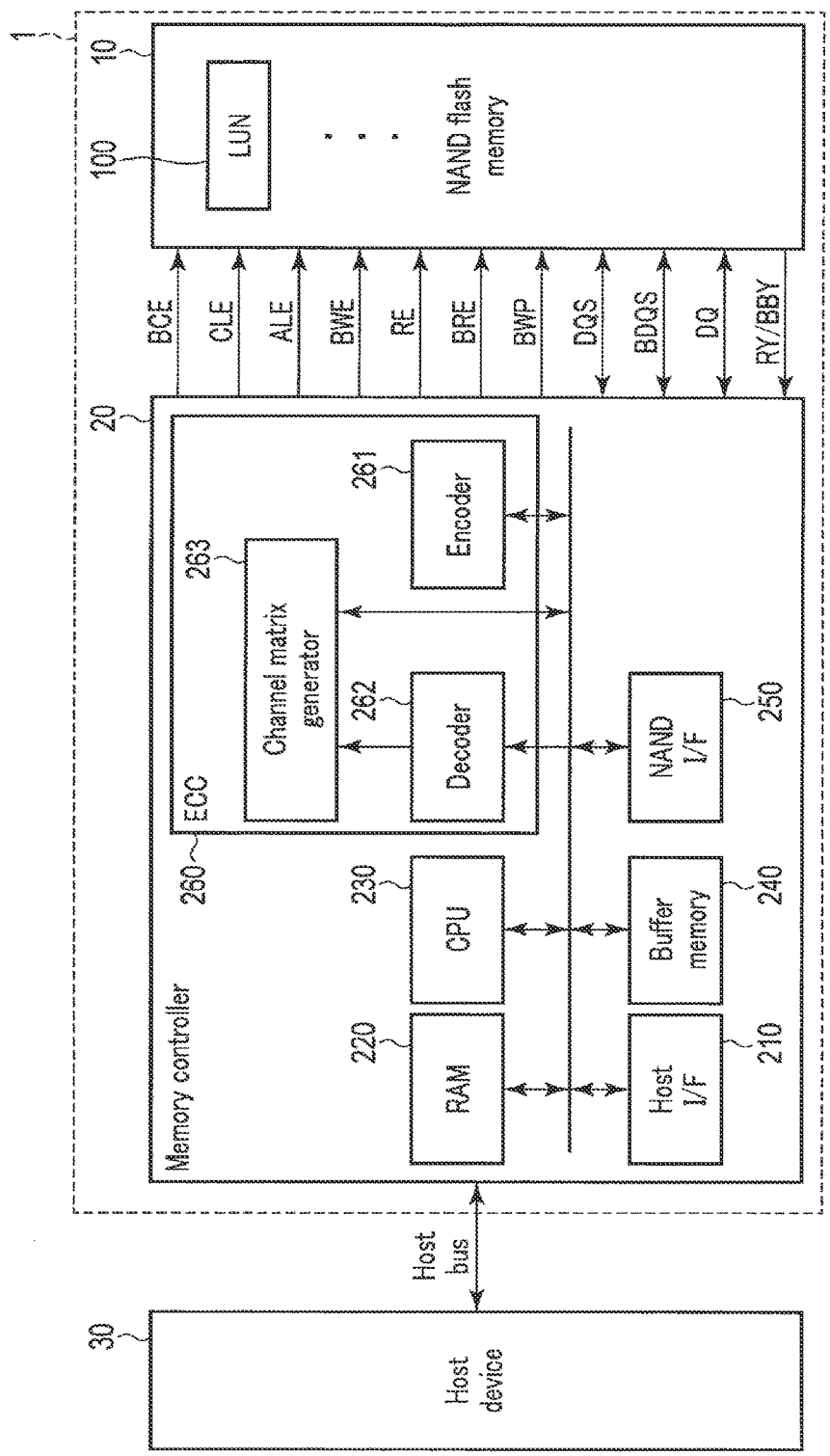
F I G. 1

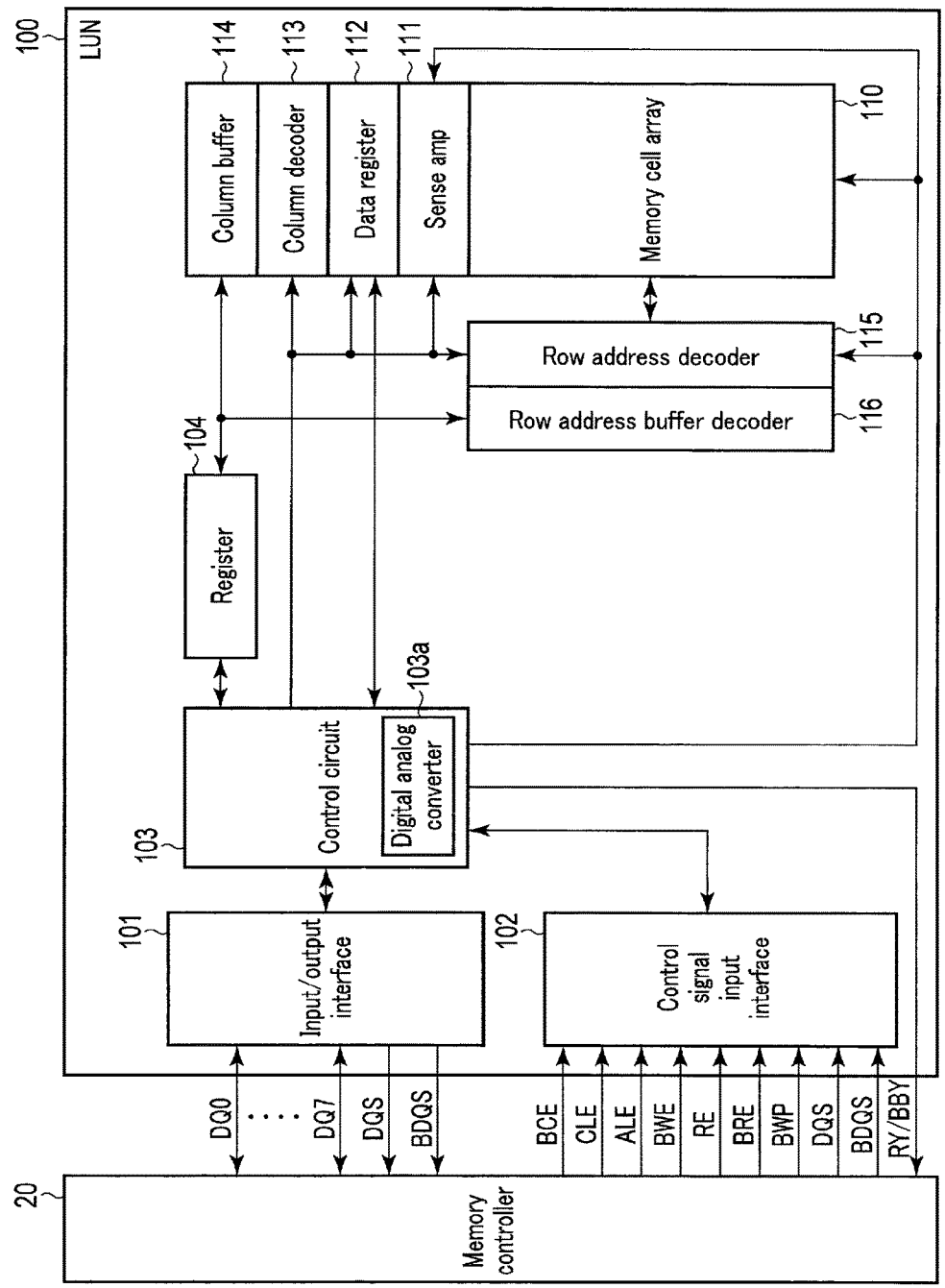
F I G. 2

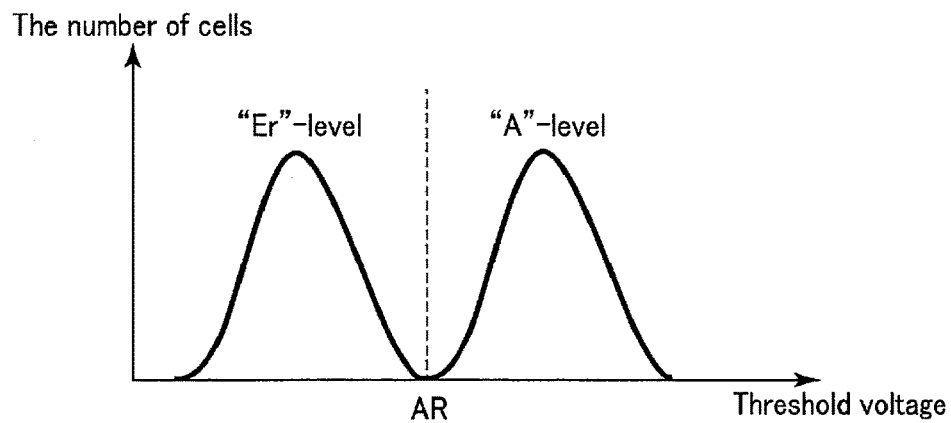
F I G. 3
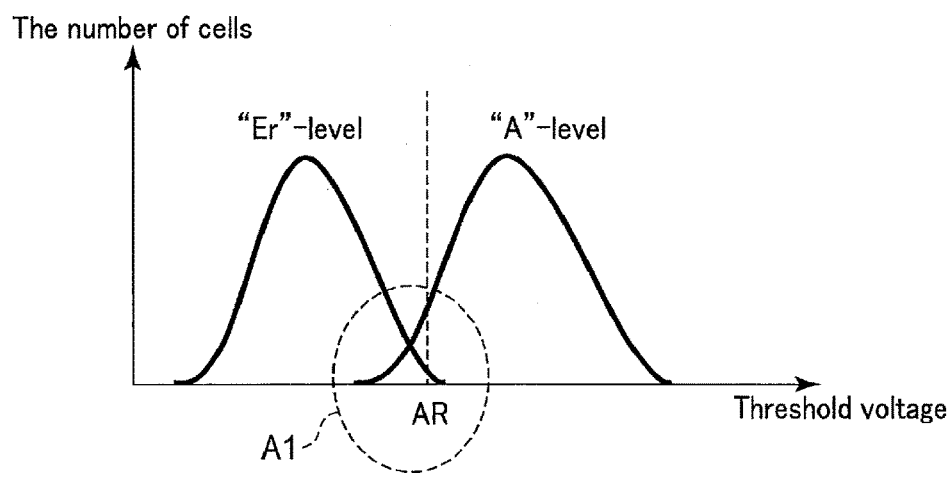
F I G. 4

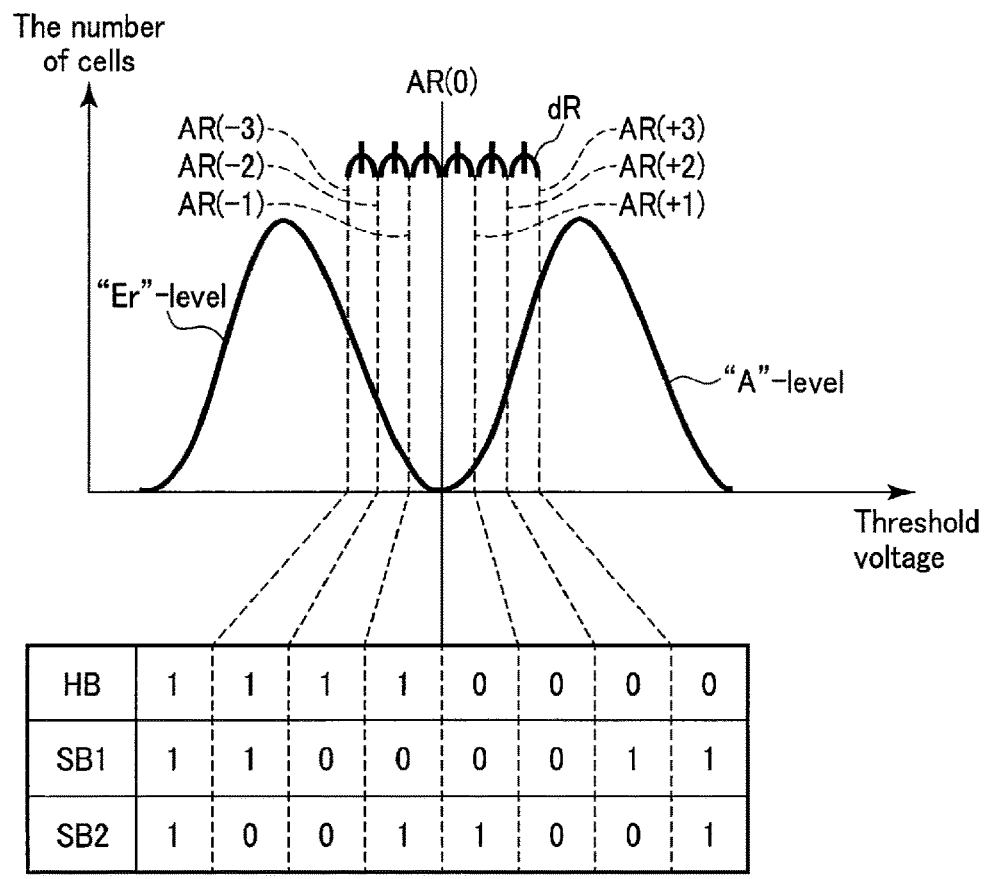
F I G. 5

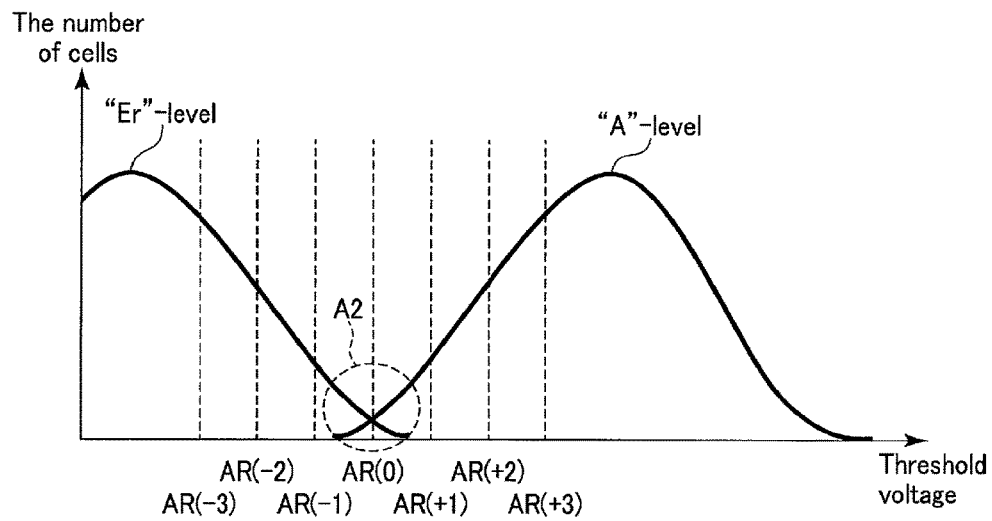
F I G. 6
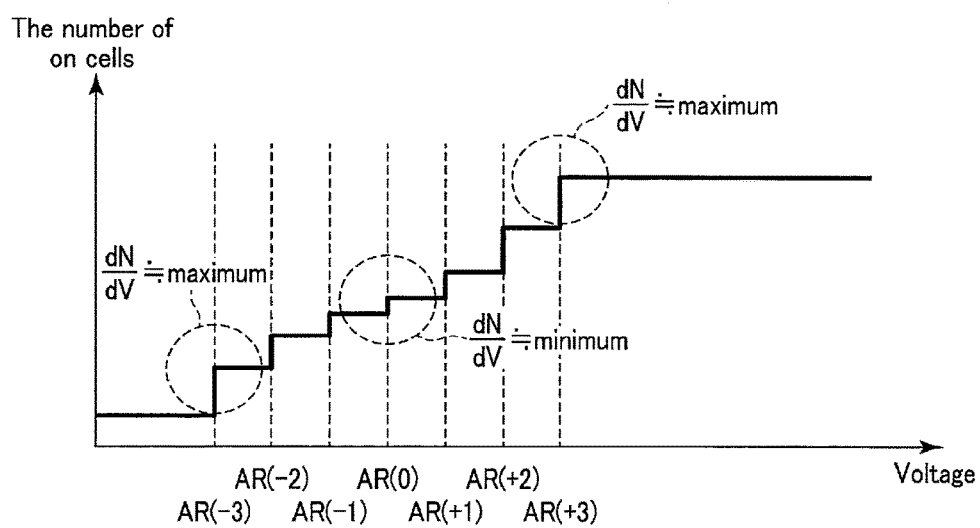
F I G. 7

|   | 111 | 011 | 001 | 101 | 100 | 000 | 010 | 110 |
|---|---|---|---|---|---|---|---|---|
| 1 | num1[0] | num1[1] | num1[2] | num1[3] | num1[4] | num1[5] | num1[6] | num1[7] |
| 0 | num0[0] | num0[1] | num0[2] | num0[3] | num0[4] | num0[5] | num0[6] | num0[7] |

F I G. 13

|   | 111 | 011 | 001 | 101 | 100 | 000 | 010 | 110 |
|---|---|---|---|---|---|---|---|---|
| 1 | 15996 | 806 | 456 | 199 | 133 | 74 | 47 | 44 |
| 0 | 0 | 0 | 0 | 2 | 64 | 482 | 2024 | 15001 |

F I G. 14

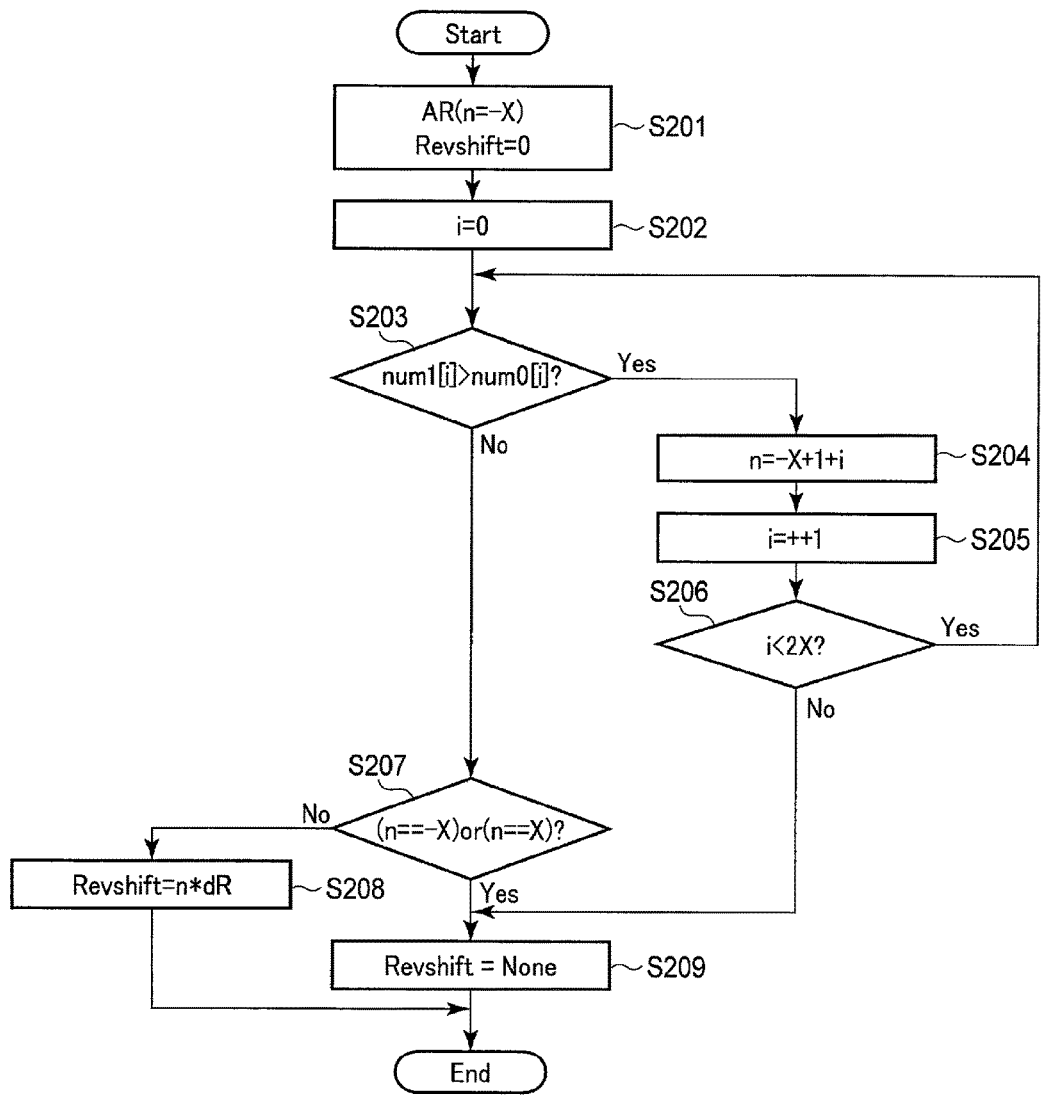
F I G. 15

| | 111 | 011 | 001 | 101 | 100 | 000 | 010 | 110 |
|---|---|---|---|---|---|---|---|---|
| 1 | 15996 | 806 | 456 | 199 | 133 | 74 | 47 | 44 |
| 0 | 0 | 0 | 0 | 2 | 64 | 482 | 2024 | 15001 |

F I G. 16

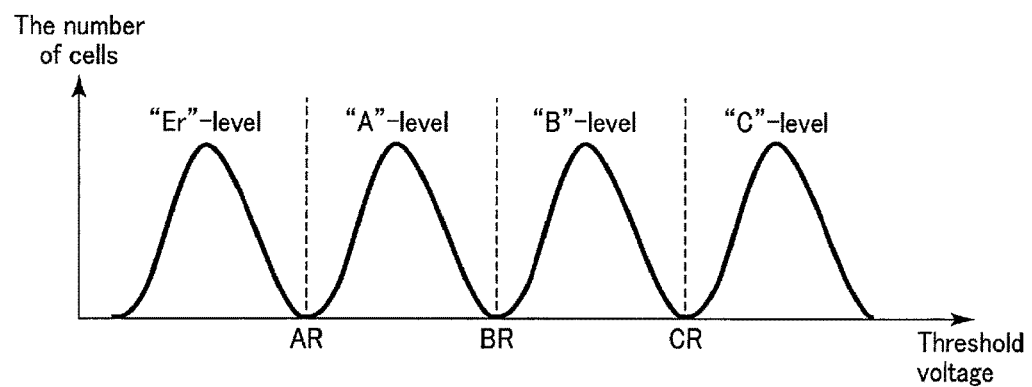
F I G. 17
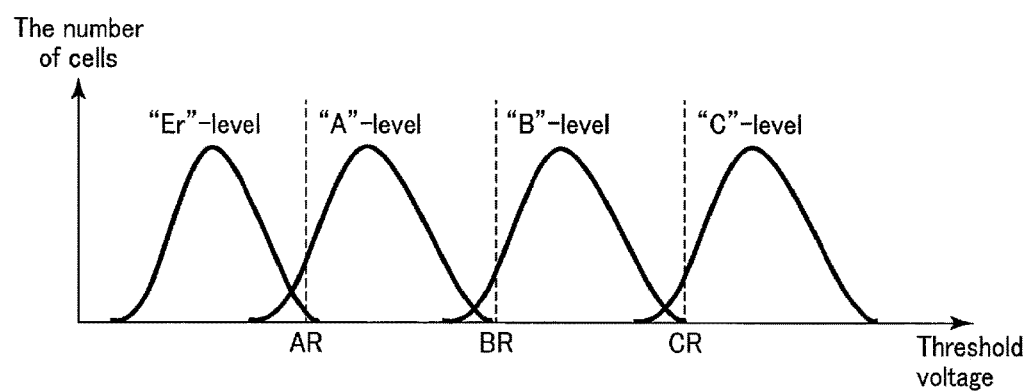
F I G. 18

| | 1111 | 1011 | 1001 | 1101 | 1100 | 1000 | 1010 | 1110 |
|---|---|---|---|---|---|---|---|---|
| 1 | num1[0] | num1[1] | num1[2] | num1[3] | num1[4] | num1[5] | num1[6] | num1[7] |
| 0 | num0[0] | num0[1] | num0[2] | num0[3] | num0[4] | num0[5] | num0[6] | num0[7] |

F I G. 25

| | 0110 | 0010 | 0000 | 0100 | 0101 | 0001 | 0011 | 0111 |
|---|---|---|---|---|---|---|---|---|
| 1 | num1[0] | num1[1] | num1[2] | num1[3] | num1[4] | num1[5] | num1[6] | num1[7] |
| 0 | num0[0] | num0[1] | num0[2] | num0[3] | num0[4] | num0[5] | num0[6] | num0[7] |

F I G. 26

| | 1111 | 1011 | 1001 | 1101 | 1100 | 1000 | 1010 | 1110 |
|---|---|---|---|---|---|---|---|---|
| 1 | 7535 | 556 | 299 | 164 | 76 | 41 | 45 | 91 |
| 0 | 0 | 0 | 0 | 2 | 10 | 56 | 365 | 8392 |

F I G. 27

| | 0110 | 0010 | 0000 | 0100 | 0101 | 0001 | 0011 | 0111 |
|---|---|---|---|---|---|---|---|---|
| 1 | 9 | 0 | 8 | 14 | 81 | 232 | 912 | 7576 |
| 0 | 8628 | 170 | 39 | 13 | 7 | 4 | 3 | 0 |

F I G. 28

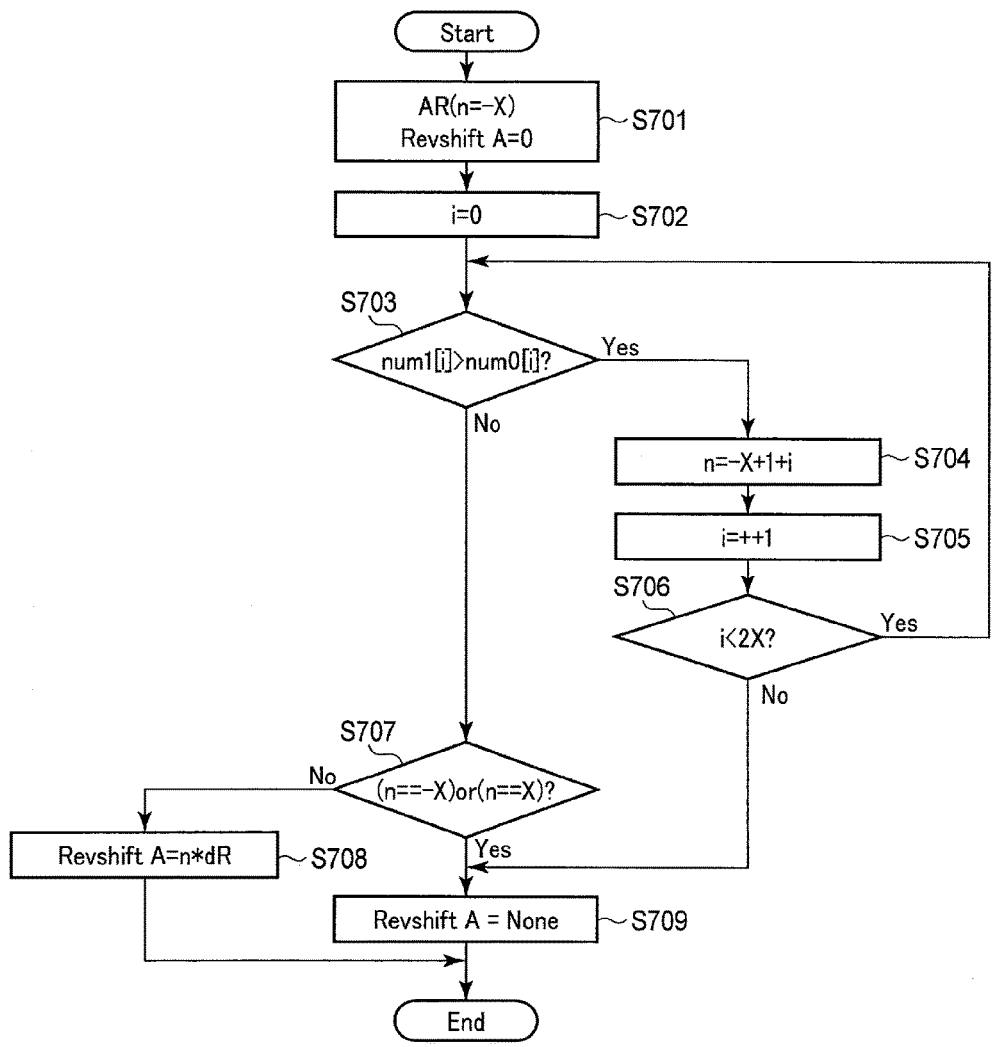
F I G. 29

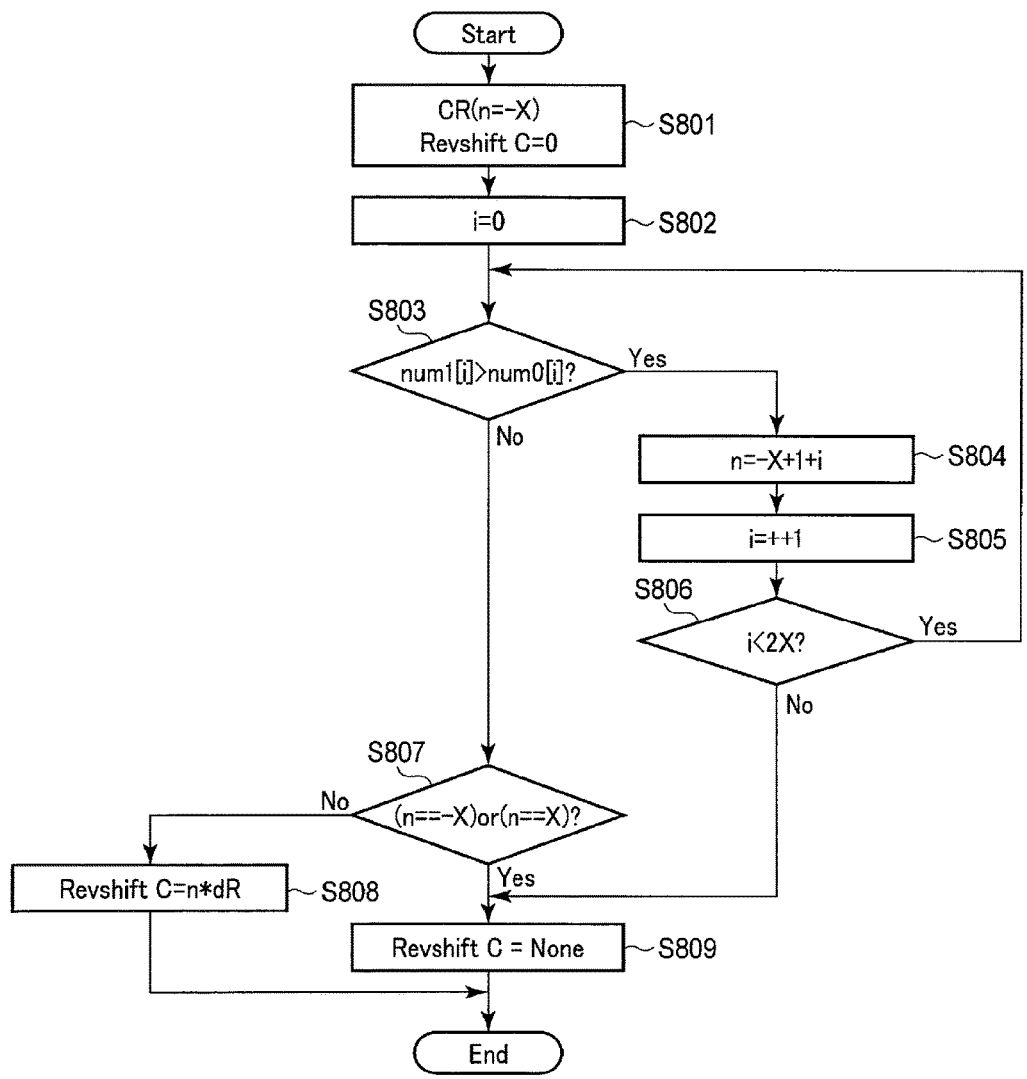
F I G. 30

| | 111 | 011 | 001 | 101 | 100 | 000 | 010 | 110 |
|---|---|---|---|---|---|---|---|---|
| 1 | 15996 | 806 | 456 | 199 | 133 | 74 | 47 | 44 |
| 0 | 0 | 0 | 0 | 2 | 64 | 482 | 2024 | 15001 |

BR(+1)

F I G. 31

|   | 1111 | 1011 | 1001 | 1101 | 1100 | 1000 | 1010 | 1110 |
|---|------|------|------|------|------|------|------|------|
| 1 | 7535 | 556  | 299  | 164  | 76   | 41   | 45   | 91   |
| 0 | 0    | 0    | 0    | 2    | 10   | 56   | 365  | 8392 |

AR(+1)

F I G. 32

|   | 0110 | 0010 | 0000 | 0100 | 0101 | 0001 | 0011 | 0111 |
|---|------|------|------|------|------|------|------|------|
| 1 | 9    | 0    | 8    | 14   | 81   | 232  | 912  | 7576 |
| 0 | 8628 | 170  | 39   | 13   | 7    | 4    | 3    | 0    |

CR(-1)

F I G. 33

|   | 111 | 011 | 001 | 101 | 100 | 000 | 010 | 110 |
|---|---|---|---|---|---|---|---|---|
| 1 | 15996 | 806 | 456 | 199 | 133 | 74 | 47 | 44 |
| 0 | 0 | 0 | 0 | 2 | 64 | 482 | 2024 | 15001 |

FBC(1)=1759

| -3dR | 15996 | 806 | 456 | 199 | 133 | 74 | 47 | 44 |
|---|---|---|---|---|---|---|---|---|
|  | 0 | 0 | 0 | 2 | 64 | 482 | 2024 | 15001 | i=++1

FBC(2)=953

| -2dR | 15996 | 806 | 456 | 199 | 133 | 74 | 47 | 44 |
|---|---|---|---|---|---|---|---|---|
|  | 0 | 0 | 0 | 2 | 64 | 482 | 2024 | 15001 | i=++1

FBC(3)=497

| -1dR | 15996 | 806 | 456 | 199 | 133 | 74 | 47 | 44 |
|---|---|---|---|---|---|---|---|---|
|  | 0 | 0 | 0 | 2 | 64 | 482 | 2024 | 15001 | i=++1

FBC(4)=300

| 0 | 15996 | 806 | 456 | 199 | 133 | 74 | 47 | 44 |
|---|---|---|---|---|---|---|---|---|
|  | 0 | 0 | 0 | 2 | 64 | 482 | 2024 | 15001 | i=++1

FBC(5)=231

| +1dR | 15996 | 806 | 456 | 199 | 133 | 74 | 47 | 44 |
|---|---|---|---|---|---|---|---|---|
|  | 0 | 0 | 0 | 2 | 64 | 482 | 2024 | 15001 | i=++1

FBC(6)=639

| +2dR | 15996 | 806 | 456 | 199 | 133 | 74 | 47 | 44 |
|---|---|---|---|---|---|---|---|---|
|  | 0 | 0 | 0 | 2 | 64 | 482 | 2024 | 15001 | i=++1

FBC(7)=2616

| +3dR | 15996 | 806 | 456 | 199 | 133 | 74 | 47 | 44 |
|---|---|---|---|---|---|---|---|---|
|  | 0 | 0 | 0 | 2 | 64 | 482 | 2024 | 15001 |

FIG. 35

|   | 1111 | 1011 | 1001 | 1101 | 1100 | 1000 | 1010 | 1110 |
|---|------|------|------|------|------|------|------|------|
| 1 | 7535 | 556  | 299  | 164  | 76   | 41   | 45   | 91   |
| 0 | 0    | 0    | 0    | 2    | 10   | 56   | 365  | 8392 |

FBC(1)=1282

−3dR

| 7535 | 556 | 299 | 164 | 76 | 41 | 45 | 91 |
|------|-----|-----|-----|----|----|----|-----|
| 0    | 0   | 0   | 2   | 10 | 56 | 365| 8392| i=++1

FBC(2)=716

−2dR

| 7535 | 556 | 299 | 164 | 76 | 41 | 45 | 91 |
|------|-----|-----|-----|----|----|----|-----|
| 0    | 0   | 0   | 2   | 10 | 56 | 365| 8392| i=++1

FBC(3)=417

−1dR

| 7535 | 556 | 299 | 164 | 76 | 41 | 45 | 91 |
|------|-----|-----|-----|----|----|----|-----|
| 0    | 0   | 0   | 2   | 10 | 56 | 365| 8392| i=++1

FBC(4)=255

0

| 7535 | 556 | 299 | 164 | 76 | 41 | 45 | 91 |
|------|-----|-----|-----|----|----|----|-----|
| 0    | 0   | 0   | 2   | 10 | 56 | 365| 8392| i=++1

FBC(5)=189

+1dR

| 7535 | 556 | 299 | 164 | 76 | 41 | 45 | 91 |
|------|-----|-----|-----|----|----|----|-----|
| 0    | 0   | 0   | 2   | 10 | 56 | 365| 8392| i=++1

FBC(6)=204

+2dR

| 7535 | 556 | 299 | 164 | 76 | 41 | 45 | 91 |
|------|-----|-----|-----|----|----|----|-----|
| 0    | 0   | 0   | 2   | 10 | 56 | 365| 8392| i=++1

FBC(7)=524

+3dR

| 7535 | 556 | 299 | 164 | 76 | 41 | 45 | 91 |
|------|-----|-----|-----|----|----|----|-----|
| 0    | 0   | 0   | 2   | 10 | 56 | 365| 8392|

F I G. 36

|   | 0110 | 0010 | 0000 | 0100 | 0101 | 0001 | 0011 | 0111 |
|---|------|------|------|------|------|------|------|------|
| 1 | 9    | 0    | 8    | 14   | 81   | 232  | 912  | 7576 |
| 0 | 8628 | 170  | 39   | 13   | 7    | 4    | 3    | 0    |

FBC(1)=245

−3dR

| 9 | 0 | 8 | 14 | 81 | 232 | 912 | 7576 |
|---|---|---|----|----|----|----|------|
| 8628 | 170 | 39 | 13 | 7 | 4 | 3 | 0 | i=++1

FBC(2)=75

−2dR

| 9 | 0 | 8 | 14 | 81 | 232 | 912 | 7576 |
|---|---|---|----|----|----|----|------|
| 8628 | 170 | 39 | 13 | 7 | 4 | 3 | 0 | i=++1

FBC(3)=44

−1dR

| 9 | 0 | 8 | 14 | 81 | 232 | 912 | 7576 |
|---|---|---|----|----|----|----|------|
| 8628 | 170 | 39 | 13 | 7 | 4 | 3 | 0 | i=++1

FBC(4)=45

0

| 9 | 0 | 8 | 14 | 81 | 232 | 912 | 7576 |
|---|---|---|----|----|----|----|------|
| 8628 | 170 | 39 | 13 | 7 | 4 | 3 | 0 | i=++1

FBC(5)=119

+1dR

| 9 | 0 | 8 | 14 | 81 | 232 | 912 | 7576 |
|---|---|---|----|----|----|----|------|
| 8628 | 170 | 39 | 13 | 7 | 4 | 3 | 0 | i=++1

FBC(6)=347

+2dR

| 9 | 0 | 8 | 14 | 81 | 232 | 912 | 7576 |
|---|---|---|----|----|----|----|------|
| 8628 | 170 | 39 | 13 | 7 | 4 | 3 | 0 | i=++1

FBC(7)=1256

+3dR

| 9 | 0 | 8 | 14 | 81 | 232 | 912 | 7576 |
|---|---|---|----|----|----|----|------|
| 8628 | 170 | 39 | 13 | 7 | 4 | 3 | 0 |

F I G. 38

MEMORY SYSTEM

CROSS-REFERENCE TO RELATED APPLICATIONS

This application claims the benefit of U.S. Provisional Application No. 62/394,318, filed Sep. 14, 2016, the entire contents of which are incorporated herein by reference.

FIELD

Embodiments described herein relate generally to a memory system.

BACKGROUND

With a development in miniaturization of memory cell transistors, a variation of a threshold distribution increases.

BRIEF DESCRIPTION OF THE DRAWINGS

FIG. 1 is a block diagram illustrating a memory system according to a first embodiment.

FIG. 2 is a block diagram illustrating a LUN of the memory system according to the first embodiment.

FIG. 3 is a view illustrating threshold distributions of memory cell transistors of the memory system according to the first embodiment.

FIG. 4 is a view illustrating threshold distributions of memory cell transistors of the memory system according to the first embodiment.

FIG. 5 is a view illustrating a relationship between threshold distributions of memory cell transistors of the memory system and stored data according to the first embodiment.

FIG. 6 is a conceptual view illustrating a Vth tracking operation.

FIG. 7 is a conceptual view illustrating the Vth tracking operation.

FIG. 13 is a table illustrating a channel matrix according to the first embodiment.

FIG. 14 is a view illustrating a concrete example of the channel matrix of FIG. 13.

FIG. 15 is a flowchart illustrating the read operation according to the first embodiment.

FIG. 16 is a view illustrating a concrete read operation using the channel matrix of FIG. 13.

FIG. 17 is a view illustrating threshold distributions of memory cell transistors of a memory system according to a second embodiment.

FIG. 18 is a view illustrating threshold distributions of memory cell transistors of the memory system according to the second embodiment.

FIG. 25 is a table illustrating a channel matrix according to the second embodiment.

FIG. 26 is a table illustrating a channel matrix according to the second embodiment.

FIG. 27 is a view illustrating a concrete example of the channel matrix of FIG. 25.

FIG. 28 is a view illustrating a concrete example of the channel matrix of FIG. 26.

FIG. 29 is a flowchart illustrating a read operation according to the second embodiment.

FIG. 30 is a flowchart illustrating the read operation according to the second embodiment.

FIG. 31 is a view illustrating a concrete read operation using the channel matrix of FIG. 13.

FIG. 32 is a view illustrating a concrete read operation using the channel matrix of FIG. 25.

FIG. 33 is a view illustrating a concrete read operation using the channel matrix of FIG. 26.

FIG. 35 is a view illustrating a concrete read operation according to the third embodiment.

FIG. 36 is a view illustrating a concrete read operation according to the third embodiment.

FIG. 38 is a view illustrating a concrete read operation according to the third embodiment.

DETAILED DESCRIPTION

Figure 8:
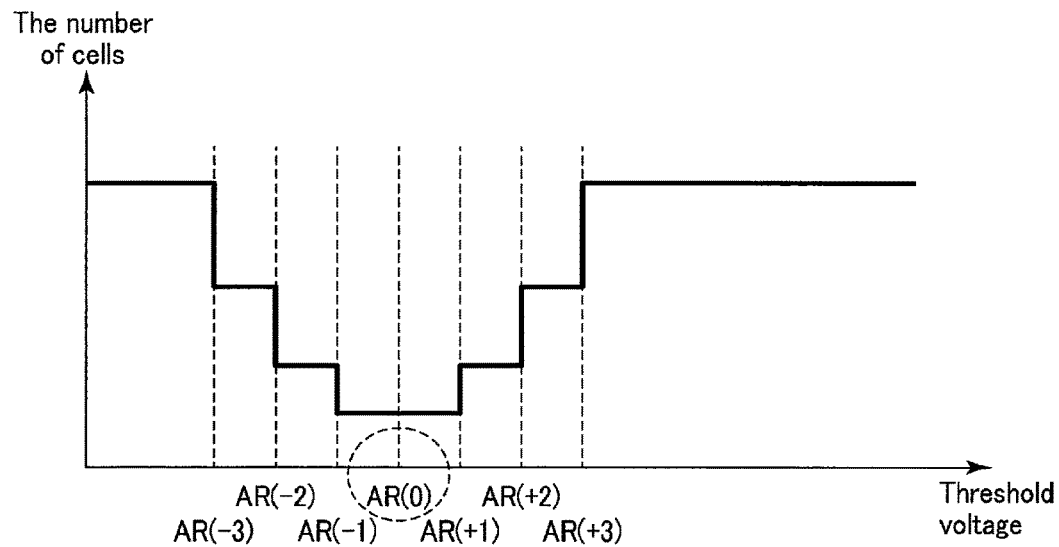
FIG. 8 is a conceptual view illustrating the Vth tracking operation.

In general, according to one embodiment, a memory system includes a decoder configured to correct an error of the data stored in a memory based on result of the first read and the second read, and output a first signal of first value indicating corrected data and a second signal of a second value indicating corrected data; a generator configured to count the first and second signals for first data items based on the result of the first and second read for generating count numbers of the first and second signals for each of the first data items; and a controller configured to compare a magnitude relation of the count numbers in order of read levels, determine the first data item when the magnitude relation changes.

Hereinafter, embodiments, which have been constructed, will be described with reference to the accompanying drawings. In the description below, structural elements having substantially the same functions and structures are denoted by like signs. A numeral in parentheses after a numeral, which constitutes a reference sign, is used in order to distinguish elements which are referred to by reference signs including the same numeral and have the same structure. When it is not necessary to distinguish elements which are indicated by reference signs including the same sign, these elements are referred to by a reference sign including only the sign. For example, when it is not necessary to distinguish elements with reference signs AR(0), AR(+1), etc., these elements are comprehensively referred to by a reference sign AR.

In addition, each of functional blocks can be realized as hardware, computer software, or a combination of both. Thus, each block will be described below, in general, from the standpoint of the function thereof, so as to make it clear that each block is any one of hardware, computer software, or a combination of both. Whether such a function is implemented as hardware or implemented as software depends on design restrictions which are imposed on a specific embodiment or the entire system. A person skilled in the art may realize these functions by various methods in each of specific embodiments, and to determine such realization is within the scope of the present invention.

<1> First Embodiment

A memory system according to a first embodiment will be described. Hereinafter, a NAND flash memory is described as an example of the memory system.

<1-1> Configuration

<1-1-1> Entire Configuration of Memory System

To begin with, a general entire configuration of the memory system according to this embodiment is described with reference to FIG. 1. FIG. 1 is a block diagram illustrating the memory system of this embodiment.

As illustrated in FIG. 1, a memory system 1 includes a NAND flash memory 10 and a memory controller 20. The NAND flash memory 10 and memory controller 20 may constitute, for example, a single semiconductor device by a combination thereof. Examples of such a single semiconductor device include a memory card such as an SD card, and an SSD (solid state driver).

The NAND flash memory 10 includes a plurality of memory cell transistors, and stores data nonvolatilely. The memory controller 20 is connected to the NAND flash memory 10 by a NAND bus, and is connected to a host device 30 by a host bus. In addition, the memory controller 20 controls the NAND flash memory 10, and accesses the NAND flash memory 10 in response to an instruction which the memory controller 20 received from the host device 30. The host device 30 is, for instance, a digital camera or a personal computer.

The NAND bus executes transmission/reception of signals according to a NAND interface. Concrete examples of these signals are a chip enable signal /CE, a command latch enable signal CLE, an address latch enable signal ALE, a write enable signal /WE, a read enable signal signal RE, /RE, a write protect signal /WP, a data strobe signal DQS, /DQS, an input/output signal DQ, and a ready/busy signal /RB. When the respective signals are not distinguished, these signals may be referred to simply as "signals".

The chip enable signal /CE is a signal for selecting a LUN (Logical unit number) 100 which is included in the NAND flash memory 10.

The command latch enable signal CLE is a signal for notifying the NAND flash memory 10 that the input/output signal DQ to/from the NAND flash memory 10 is a command.

The address latch enable signal ALE is a signal for notifying the NAND flash memory 10 that the input/output signal DQ to/from the NAND flash memory 10 is an address.

The write enable signal /WE is a signal for causing the input/output signal DQ to be taken in the NAND flash memory 10.

The read enable signal RE is a signal for reading the input/output signal DQ from the NAND flash memory 10. The read enable signal /RE is a complementary signal of the signal RE.

The write protect signal is a signal for protecting data from unexpectable erase or write, when an input signal is uncertain, for example, at a time of power-on or power-off of the NAND flash memory 10.

The input/output signal DQ is, for example, an 8-bit signal. In addition, the input/output signals DQ are a command, an address, write data and read data, which are transmitted/received between the NAND flash memory 10 and memory controller 20.

The data strobe signal DQS is a signal for transmitting/receiving the input/output signal DQ (data) between the memory controller 20 and NAND flash memory 10. The data strobe signal /DQS is a complementary signal of the DQS. The NAND flash memory 10 receives the input/output signal DQ (data) in accordance with the timing of the data strobe signals DQS and /DQS which are supplied from the memory controller 20. The memory controller 20 receives the input/output signal DQ (data) in accordance with the timing of the data strobe signals DQS and /DQS which are supplied from the NAND flash memory 10.

The ready/busy signal /RB is a signal indicating whether the LUN 100 is in a ready state (a state in which the LUN 100 can receive an instruction from the memory controller 20), or in a busy state (a state in which the LUN 100 cannot receive an instruction from the memory controller 20).

<1-1-2> Configuration of Memory Controller

Referring to FIG. 1, the details of the configuration of the memory controller 20 will be described. As illustrated in FIG. 1, the memory controller 20 includes a host interface (Host I/F) 210, a built-in memory (RAM: Random access memory) 220, a processor (CPU: Central processing unit) 230, a buffer memory 240, a NAND interface (NAND I/F) 250, and an ECC (Error correction code) circuit 260.

The host interface 210 is connected to the host device 30 via the host bus, and transfers an instruction and data, which have been received from the host device 30, to the CPU 230 and buffer memory 240. Responding to an instruction of the CPU 230, the host interface 210 transfers the data in the buffer memory 240 to the host device 30.

The CPU 230 controls the operation of the entirety of the memory controller 20. For example, when the CPU 230 received a write instruction from the host device 30, the CPU 230 issues, in response to the write instruction, a write instruction to the NAND interface 250. The same applies to the cases of read and erase. The CPU 230 executes various processes for managing the NAND flash memory 10, such as wear leveling.

The NAND interface 250 is connected to the NAND flash memory 10 via the NAND bus, and controls communication with the NAND flash memory 10. In addition, based on an instruction received from the CPU 230, the NAND interface 250 outputs a signal according to the NAND interface to the NAND flash memory 10. At a write time, the NAND interface 250 transfers a write command, which was issued by the CPU 230, and write data in the buffer memory 240, to the NAND flash memory 10 as input/output signals DQ. Furthermore, at a read time, the NAND interface 250 transfers a read command, which was issued by the CPU 230, to the NAND flash memory 10 as an input/output signal DQ, and also receives data, which was read from the NAND flash memory 10, as an input/output signal DQ, and transfers this input/output signal DQ to the buffer memory 240.

The RAM 220 is, for example, a semiconductor memory such as a DRAM (Dynamic random access memory), and is used as a work area of the CPU 230. In addition, the RAM 220 stores firmware and various management tables for managing the NAND flash memory 10.

The buffer memory 240 temporarily stores write data and read data.

The ECC circuit 260 includes an encoder 261, a decoder 262, and a channel matrix generator 263.

The encoder 261 generates an error correcting code and imparts the error correcting code to write data. The ECC circuit 260 supplies the write data, to which the error correcting code was imparted, to the NAND flash memory 10 via, for example, the NAND interface 250. The decoder 262 decodes encoded data which was read. The encoding and decoding are executed in units of an ECC frame which is composed of a plurality of bit data. In the meantime, the write and read unit of the NAND flash memory 10 is a plurality of ECC frames. The ECC circuit 260 of the present embodiment uses, in addition to codes for hard-decision decoding, error correcting codes for performing soft-decision decoding by repetitive calculations based on probability. The error correcting codes for soft-decision decoding is, for example, an LDPC (Low Density Parity Check) code.

In the hard-decision decoding, the decoder 262 receives HB data which was read from the NAND flash memory 10 by the application of a hard-bit (HB) read voltage. In addition, the decoder 262 executes an arithmetic operation by using HB information which indicates whether data is "0" or "1", and the parity which is imparted to the ECC frame.

A brief description is given of the soft-decision decoding of encoded data. In the soft-decision decoding, the decoder 262 receives SB data including reliability information (degree of certainty) of HB data, which was read from the NAND flash memory 10 by the application of a plurality of soft-bit (SB) read voltages. Then, the decoder 262 acquires an LLR based on the SB data and an LLR (Log-likelihood Ratio) table which is stored, for example, in the RAM 220. The LLR table is a table for associating the read data and the LLR. Then, the decoder 262 executes an error correcting process by performing repetitive calculations based on the probability in units of the ECC frame, on the basis of the LLR.

If the decoder 262 successfully executes the error correcting process (decode) of the read data, the decoder 262 supplies the data after the error correcting process to the channel matrix generator 263.

The channel matrix generator 263 receives the successfully decoded data from the decoder 262, and receives data (data corresponding to the successfully decoded data) from the NAND flash memory 10 via the NAND interface 250. Based on the two kinds of received data, the channel matrix generator 263 generates a channel matrix. The channel matrix generator 263 outputs the channel matrix to the RAM 220 or the like. The channel matrix will be described later in detail.

<1-1-3> Configuration of LUN

Next, referring to FIG. 2, the configuration of the LUN 100 will be described.

The memory controller 20 and the LUN 100 are connected via an input/output interface 101 and a control signal input interface 102.

The input/output interface 101 receives input/output signals (DQ0 to DQ7) via data input/output lines (wiring lines of the NAND bus, which transmit/receive input/output signals DQ). The input/output interface 101 outputs input/output signals (DQ0 to DQ7) via the data input/output lines. When the input/output interface 101 outputs input/output signals (DQ0 to DQ7) from the data input/output lines, the input/output interface 101 outputs data strobe signals DQS and /DQS to the memory controller 20.

The control signal input interface 102 receives, from the memory controller 20, a chip enable signal /CE, a command latch enable signal CLE, an address latch enable signal ALE, a write enable signal /WE, a read enable signal RE, /RE, a write protection signal /WP, and a data strobe signal DQS, /DQS.

Although not illustrated in FIG. 2, the LUN 100 is also provided with Vcc/Vss/Vccq/Vssq terminals for power supply.

A control circuit 103 outputs data, which was read from a memory cell array 110, to the memory controller 20 via the input/output interface 101. The control circuit 103 receives various commands of write, read, erase and status read, addresses, and write data via the control signal input interface 102.

The control circuit 103 controls a register 104, a sense amp 111, a data register 112, a column decoder 113, and a row address decoder 115.

The control circuit 103 supplies desired voltages to the memory cell array 110, sense amp 111 and row address decoder 115 at times of data program, verify, read and erase.

The control circuit 103 includes a digital analog converter 103a. The digital analog converter 103a generates a read voltage at a read operation time, and a program voltage at a write operation time, based on preset numerical value data. For example, when data of an Er level and data of an A level are stored in a memory cell transistor, numerical value data, which is necessary for reading the data of A level, is preset. The numerical value data for reading the A level is stored, for example, in a data area for a controller in the memory cell array 110. The control circuit 103 reads the above-described numerical value data from the memory cell array 110 at a power-on time, and transfers the numerical value data to the register 104. At a read operation time, the control circuit 103 generates a desired read voltage, based on the numerical value data stored in the register.

The register 104 stores a command which is input from the control circuit 103.

The register 104 stores an address which is supplied from, for example, the memory controller 20. In addition, the register 104 converts stored addresses to internal physical addresses (column address and row address). Then, the register 104 supplies the column address to a column buffer 114, and the row address to a row address buffer decoder 116.

In addition, the register 104 stores information for informing the outside about various states of the inside of the LUN 100. The register 104 includes a ready/busy register (not shown) for storing data indicating whether the LUN 100 is in a ready state or a busy state, and a write status register (not shown) for storing data indicating pass/fail of write.

The memory cell array 110 includes a plurality of bit lines, a plurality of word lines, and source lines. The memory cell array 110 is composed of a plurality of blocks BLK in which electrically rewritable memory cell transistors (also referred to simply as "memory cells") MC are arranged in a matrix. The memory cell transistor MC includes, for example, a multilayer gate including a control gate electrode and a charge accumulation layer (e.g. a floating gate electrode), and stores single-level data or multilevel data by a variation of a threshold of the transistor which is determined by a charge amount injected in the floating gate electrode. In addition, the memory cell transistor MC may have a MONOS (Metal-Oxide-Nitride-Oxide-Silicon) configuration which traps electrons in a nitride film.

The sense amp 111 senses data, which was read from the memory cell transistor MC to the bit line, at a data read operation time.

The data register 112 is composed of an SRAM or the like. The data register 112 stores data which was supplied from the memory controller 20, or a verify result detected by the sense amp 111.

The column decoder 113 decodes a column address signal stored in the column buffer 114, and outputs a select signal, which selects any one of the bit lines, to the sense amp 111.

The column buffer 114 temporarily stores the column address signal which is input from the register 104.

The row address decoder 115 decodes a row address signal which is input via the row address buffer decoder 116. In addition, the row address decoder 115 selects and drives a word line and a select gate line SGD, SGS of the memory cell array 110.

The row address buffer decoder 116 temporarily stores the row address signal which is input from the register 104.

<1-1-4> Threshold Distributions of Memory Cell Transistors

Referring to FIG. 3, a description will be given of data and threshold distributions which the memory cell transistors according to this embodiment can take. The abscissa of FIG. 3 indicates a threshold voltage of memory cell transistors, and the ordinate indicates the number of memory cell transistors. Incidentally, the ordinate is on a log scale.

As illustrated in FIG. 3, each memory cell transistor can store data of, for example, 1 bit, in accordance with the threshold voltage thereof.

This 1-bit data is, for example, "1" and "0", in the order from the threshold voltage that is low.

The threshold voltage of the memory cell transistor, which stores "1" data, is an "Er" level. The Er level is a threshold voltage in a state in which data was erased, and is either a positive value or a negative value (e.g. less than a voltage AR).

The "0" data corresponds to a threshold voltage in a state in which data was written. The threshold voltage of the memory cell transistor, which stores "0" data, is an "A" level, which is higher than the "Er" level (e.g. not less than the voltage AR).

In the meantime, in the memory cell transistor, each time write and read are executed, electrons penetrate a gate insulation film that is an insulator. Thus, the gate insulation film deteriorates with an increase in the number of times of write and the number of times of read.

In addition, with a development in size of the memory cell transistor, the amount of charge accumulated in the charge accumulation layer of the memory cell transistor decreases. Thus, the influence of interference noise from neighboring memory cell transistors relatively increases. Specifically, by executing data write or data read of one memory cell transistor, the data of the other neighboring memory cell transistor may vary in some cases.

For example, data write is executed to a memory cell transistor which is selected by a word line and a bit line. However, in some cases, a weak write state occurs in a non-selected memory cell transistor, and there occurs a program disturb (PD) phenomenon in which a threshold voltage increases.

In addition, in data read, too, in some cases, a weak write state occurs in a non-selected memory cell transistor, and there occurs a read disturb (RD) phenomenon in which a threshold voltage increases.

Besides, when a memory cell transistor has not been accessed for a long time, there may be a case in which electrons are gradually released from the charge accumulation layer of the memory cell transistor, and there occurs a data retention (DR) phenomenon in which a threshold voltage decreases.

Due to various factors as described above, the threshold voltage of the memory cell transistor may vary, as illustrated in FIG. 4. As a result, as indicated by a broken line A1 of FIG. 4, the distribution of the Er level and the distribution of the A level may overlap. Due to such a displacement of the distribution, an error would occur.

<1-2> Operation

<1-2-1> Outline of Read Operation

Here, the outline of the read operation will be described.

The read operation to be described in this embodiment is generally classified into an HB read operation and an SB read operation. As illustrated in FIG. 5, in the HB read operation, the control circuit 103 applies a voltage for HB read (here, voltage AR (0)) to a selected word line. Thereby, since the control circuit 103 can determine the threshold voltage of the memory cell transistor, the control circuit 103 can read HB data.

However, as described with reference to FIG. 4, when the memory cell transistor underwent various influences, there is a case in which data cannot correctly be read by the voltage for the HB read operation.

When hard-decision decoding failed, an SB read operation is performed in order to execute soft-decision decoding with higher error correction capability. As illustrated in FIG. 5, in the SB read operation, the control circuit 103 applies, as needed, a plurality of SB read voltages (here, voltages AR (−3) to AR (−1), voltages AR (+1) to AR (+3)) to the memory cell transistor. Incidentally, the number of SB read voltages is not limited to three on each of the low voltage side and high voltage side of the HB read voltages, as illustrated in FIG. 5. In addition, the voltages AR (−3) to AR (+3) are set at intervals of a voltage dR. The voltages AR (−3) to AR (+3) are set by digital values, and the digital values are converted to the voltages AR (−3) to AR (+3) by the digital analog converter 103a.

In the meantime, the information of voltages for the HB read operation and SB read operation is preset based on design, fabrication conditions, etc. In addition, the information (digital values) of voltages for the HB read operation and SB read operation is stored, for example, in the data area for the controller in the memory cell array 110.

As illustrated in FIG. 5, a hard-decision bit ("HB" in FIG. 5) can be obtained by a result of an HB read operation using the voltage AR (0). A first soft-decision bit ("SB1" in FIG. 5) can be obtained by an ENOR operation of SB read operation results using the voltages AR (−2) and AR (+2). A second soft-decision bit ("SB2" in FIG. 5) can be obtained by an ENOR operation of SB read operation results using the voltages AR (−3), AR (−1), AR (+1) and AR (+3).

The three bits of "SB2", "SB1" and "HB" are used as indices which indicate corresponding read levels.

<1-2-2> Outline of Vth Tracking

Next, the outline of Vth tracking relating to this embodiment will be described.

In the meantime, as described above, there is a case in which neighboring threshold distributions of memory cell transistors overlap due to spreading in width of the distributions or a shift of the distributions. Even in such a case, by correcting an error by the ECC circuit 260, data can correctly be read. However, the ECC circuit 260 cannot correct errors without limitations, and the number of bits, which can be error-corrected, is limited. Specifically, if the number of error bits, which have occurred, exceeds the number of bits which can be error-corrected by the ECC circuit 260, the ECC circuit 260 cannot correctly correct data. Accordingly, it is preferable that the memory system 1 searches a position where the number of error bits, which have occurred, is small, that is, the position (voltage) of an intersection where two threshold distributions overlap. To search the position (proper read voltage) of an intersection where two threshold distributions overlap is called "Vth tracking". By executing read at the position (proper read voltage) of the intersection where two threshold distributions overlap, the number of read error bits can be minimized. As a result, it is possible to prevent the number of error bits, which have occurred, from exceeding the number of bits which can be error-corrected by the ECC circuit 260.

Referring to FIG. 6 to FIG. 8, the concept of finding a proper read voltage AR (n: integer) is described.

FIG. 6 illustrates a case in which an absolute value of an inclination of a bottom portion of the distribution of the Er level is substantially equal to an absolute value of an inclination of a bottom portion of the distribution of the A level. As illustrated in FIG. 6, the distribution of the Er level and the distribution of the A level intersect at a broken-line portion A2. Incidentally, the ordinate of FIG. 6 is expressed on a log scale.

FIG. 7 is a graph illustrating the number of on-cells (a cumulative value of the number of memory cells which are set in an ON state) relative to a voltage VCGRV that is applied to a selected word line. Incidentally, the ordinate of FIG. 7 is expressed on a linear scale.

As illustrated in FIG. 7, if the voltage VCGRV of the selected word line is increased, the number of on-cells sharply increases at the voltage AR (−3), and dN/dV becomes maximum (where, N is the number of on-cells, and V is the voltage of the selected word line). If the voltage VCGRV is further increased, the rate of increase of the number of on-cells decreases and becomes minimum at a certain value of the voltage. The rate of increase of this voltage VCGRV becomes zero when the "Er" level and "A" level do not overlap. On the other hand, when the "Er" level and "A" level overlap, the rate of increase becomes a certain minimum value that is not zero (>0). Then, if the voltage VCGRV is further increased, the rate of increase of the number of on-cells increases once again, and the dN/dV becomes maximum once again at the voltage AR (+3).

Based on the above-described variation of the cumulative value of the number of on-cells, it is assumed that the voltage, at which the dN/dV becomes minimum, is the intersection between the "Er" level and the "A" level. The voltage at this intersection, that is, the voltage VCGRV, at which the rate of increase of the cumulative value of the number of on-cells becomes minimum, is set as the voltage that is to be found.

FIG. 8 illustrates a histogram indicating the number of memory cells which are first turned on when the voltage of the word line is varied by only one step, and a threshold distribution obtained by the histogram. Specifically, FIG. 8 illustrates a difference between the number N(n) of memory cell transistors, which are turned on when a voltage AR (n) was applied, and the number N(n−1) of memory cell transistors, which are turned on when a voltage AR (n−1) was applied.

As a result of the above, the threshold distribution as illustrated in FIG. 8 is derived. Based on this distribution, the memory controller 20 estimates that the voltage AR (0) is the position where the dN/dV=minimum, as described above, and the memory controller 20 sets the voltage AR (0) as a proper voltage.

As described above, when the absolute value of the inclination of the bottom portion of the distribution of the Er level is substantially equal to the absolute value of the inclination of the bottom portion of the distribution of the A level, the intersection between the distribution of the Er level and the distribution of the A level can be derived by the above-described method.

However, there is a case in which the absolute value of the inclination of the bottom portion of the distribution of the Er level is different from the absolute value of the inclination of the bottom portion of the distribution of the A level. What problem will occur in this case is described.

Figure 9:
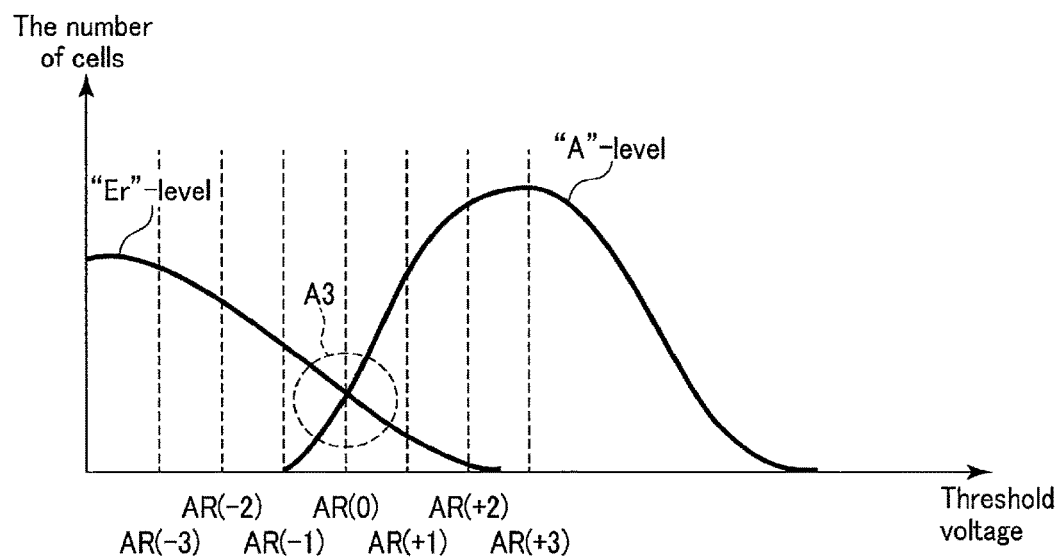
FIG. 9 is a conceptual view illustrating the Vth tracking operation.

As illustrated in FIG. 9, there is a case in which the inclination of the bottom portion of the distribution of the Er level is gentler than the inclination of the bottom portion of the distribution of the A level. As illustrated in FIG. 9, the distribution of the Er level and the distribution of the A level intersect at a broken-line portion A3.

Figure 10:
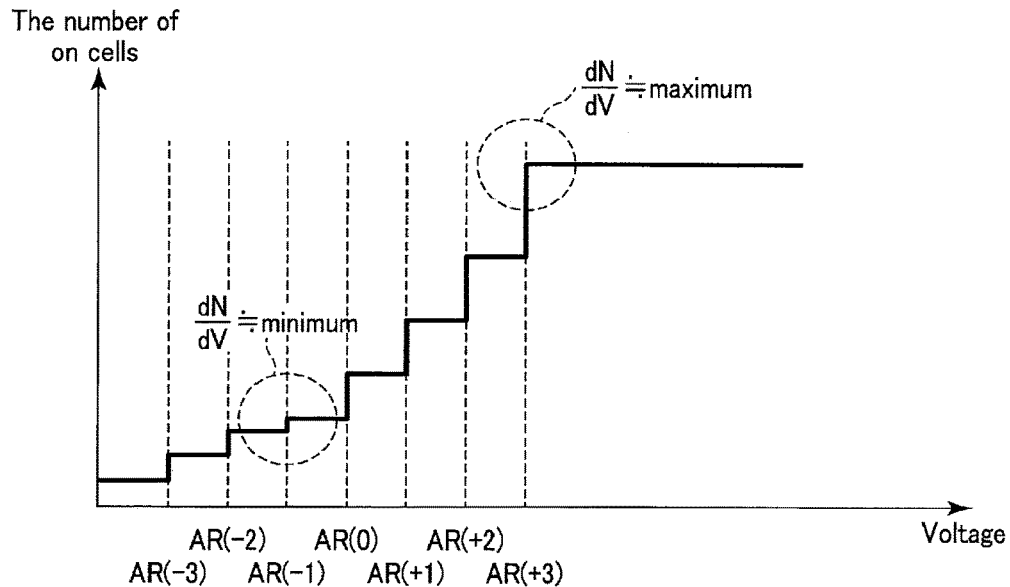
FIG. 10 is a conceptual view illustrating the Vth tracking operation.

FIG. 10 is a graph showing the number of on-cells relative to the voltage VCGRV that is applied to the selected word line. In this example, the increase of the number of on-cells at a time when the voltage AR (−1) was applied is less than the increase of the number of on-cells at a time when the voltage AR (0) was applied.

Figure 11:
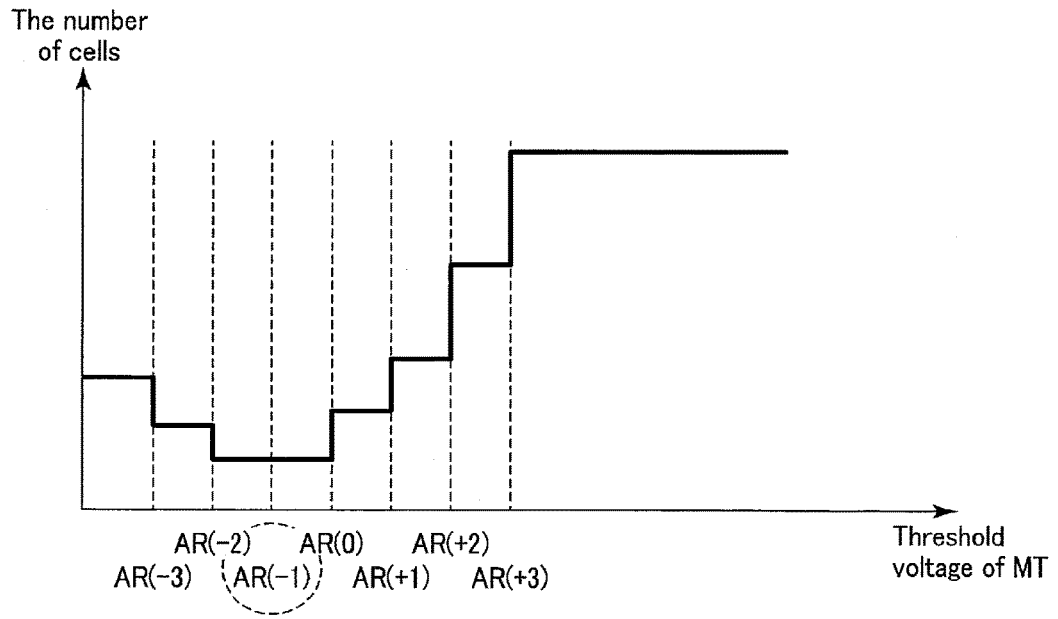
FIG. 11 is a conceptual view illustrating the Vth tracking operation.

As a result of the above, the threshold distribution as illustrated in FIG. 11 is derived. Based on this distribution, the memory controller 20 estimates that the voltage AR (−1) is the position where the dN/dV=minimum, as described above, and the memory controller 20 sets the voltage AR (−1) as a proper voltage.

As illustrated in FIG. 9, the intersection between the distribution of the Er level and the distribution of the A level is at the voltage AR (0). Specifically, a proper voltage should be set at the voltage AR (0), and not at the voltage AR (−1). However, in the above-described Vth tracking, it is possible that a voltage cannot properly be derived due to the shape of the bottom portion of the distribution.

Figure 12:
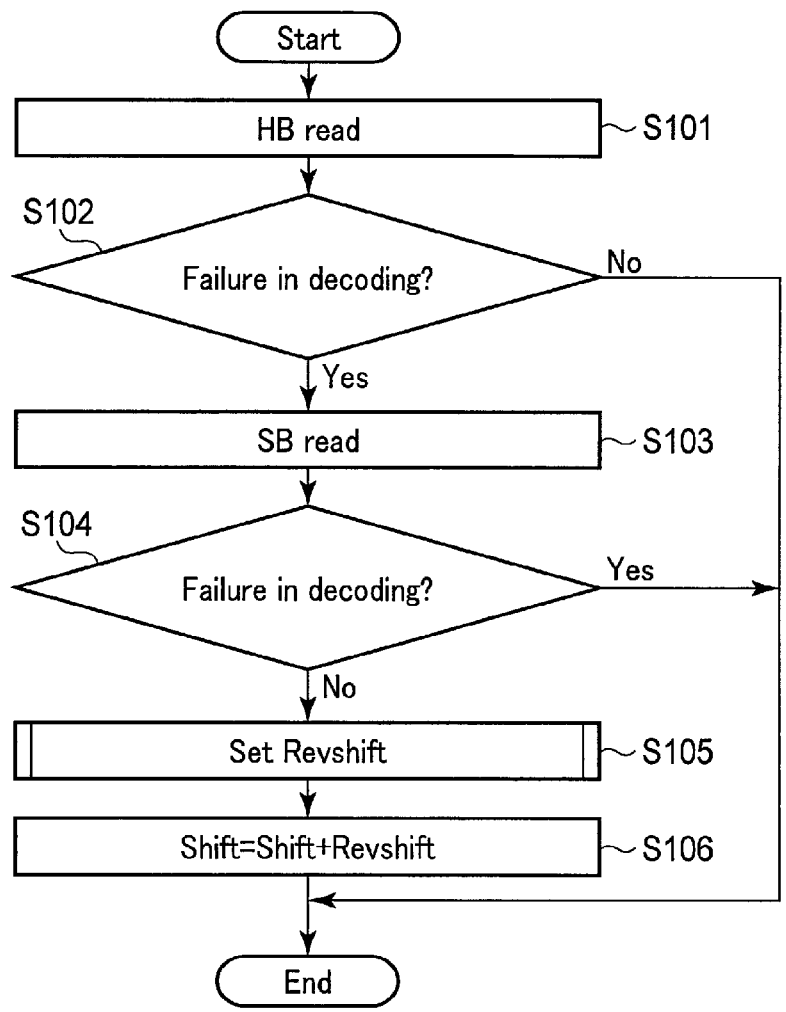
FIG. 12 is a flowchart illustrating a read operation according to the first embodiment.

Referring to FIG. 12, a description is given of a method of more appropriately deriving a proper voltage AR (n: integer).

<1-2-3> Read Operation

[Step S101]

The memory controller 20 issues a first read command, and the NAND flash memory 10 reads data of one page in response to this first read command. Incidentally, this read operation is an HB read operation.

Upon receiving the first read command, the NAND flash memory 10 reads HB data by using the read voltage AR (n) for HB read. In addition, the NAND flash memory 10 sends the read HB data to the memory controller 20.

[Step S102]

The ECC circuit 260 executes an ECC process (hard-decision decoding process) with respect to the received HB data. If the ECC circuit 260 successfully corrects an error of the HB data by the ECC process (hard-decision decoding process) (step S102, No), the read operation is terminated.

[Step S103]

If the ECC circuit 260 fails to correct an error of the HB data by the ECC process (hard-decision decoding process) (step S102, Yes), the memory controller 20 issues a second read command which is different from the first read command. Responding to this second read command, the NAND flash memory 10 reads data. Incidentally, this read operation is an SB read operation.

Upon receiving the second read command, the NAND flash memory 10 reads SB data by using a plurality of read voltages AR for SB read.

Specifically, the control circuit 103 executes the SB read operation by using the voltage AR (−1), voltage AR (−2), voltage AR (−3), voltage AR (+1), voltage AR (+2) and voltage AR (+3), which are shifted to the minus side and plus side in units of a voltage dR from the voltage AR (n ("0" in this example)) that is used at the time of the HB read operation.

Then, the NAND flash memory 10 sends the SB data, which was obtained by the SB read operation, to the memory controller 20.

[Step S104]

Based on the received SB data, the ECC circuit 260 executes an ECC process (soft-decision decoding process). In addition, based on the result of the ECC process (soft-decision decoding process), the ECC circuit 260 finally determines the read data. If the ECC circuit 260 fails to correct an error by the ECC process (soft-decision decoding process) (step S104, Yes), the memory controller 20 terminates the read operation.

Hereinafter, the operation of the channel matrix generator 263 at the time of the ECC process (soft-decision decoding process) will be described. The channel matrix generator 263 detects a correct bit value (written bit value) and a read level (or index) with respect to each of bits that form an input frame. The correct bit value can be detected if the bit value of a decoded frame is referred to. The channel matrix generator 263 generates a channel matrix by counting the number of occurrences of the combination between the correct bit value and the read level.

Specifically, the channel matrix generator 263 can generate a channel matrix, for example, as illustrated in FIG. 13. The size of the matrix of FIG. 13 is 2 rows×8 columns. Incidentally, the size of the matrix is not limited to this. In the matrix of FIG. 13, the row represents a correct bit value, and the column represents an index corresponding to a read level. For example, if the correct bit value of a certain bit in the input frame is "1", and the index of the read level is "111", the channel matrix generator 263 counts up an element (num1[0]) of the first row and first column of the channel matrix by "1". For example, if a channel matrix is actually generated, a channel matrix as illustrated in FIG. 14 is generated. In the present embodiment, this channel matrix is used when the voltage AR (n) for the HB read operation is derived, as will be described later.

The CPU 230 generates an LLR table, based on the generated channel matrix. The CPU 230 sets the generated LLR table in the decoder 262, as needed.

[Step S105]

If the ECC circuit 260 successfully corrects an error by the ECC process (soft-decision decoding process) (step S104, No), the memory controller 20 derives a shift value Revshift of a proper voltage for adjusting the voltage AR (n) for the HB read operation.

In the Vth tracking operation as described in FIG. 6 to FIG. 11, there is a case in which a proper read voltage cannot be derived, depending on the shape of the distribution.

Thus, in this embodiment, the read voltage, which corresponds to the intersection of the distribution of the Er level and the distribution of the A level, is derived by referring to the above-described channel matrix.

Referring to FIG. 15, a description is given of a method of deriving the shift value Revshift with use of the channel matrix.

[Step S201]

The CPU 230 first sets a variable n of the voltage AR (n) at "−X", and sets the shift value Revshift at the initial value (here, 0). The value "X" is an arbitrary integer, and is a value which is obtained by subtracting "1" from "−m" relating to a minimum read voltage AR (−m (m is a positive integer)) among a plurality of SB read voltages. In addition, the value "X" is a value which is obtained by adding "1" to "m" relating to a maximum read voltage AR (m) among the plural SB read voltages.

[Step S202]

Subsequently, the CPU 230 sets a variable i at the initial value (here, 0).

[Step S203]

The CPU 230 determines whether an element num1[i] of the channel matrix is greater than an element num0[i].

If the element num1[i] of the channel matrix is greater than the element num0[i], it turns out that the distribution of the Er level exists above the distribution of the A level. Conversely, if the element num1[i] of the channel matrix is not greater than the element num0[i], it turns out that the distribution of the Er level exists below the distribution of the A level. Specifically, the CPU 230 derives a position at which the large/small relationship between the element num1[i] of the channel matrix and the element num0[i] is reversed. Thereby, the CPU 230 can estimate the intersection between the distribution of the Er level and the distribution of the A level.

[Step S204]

If the CPU 230 determines that the element num1[i] of the channel matrix is greater than the element num0[i] (step S203, Yes), the CPU 230 updates the variable n to "−X+1+i".

[Step S205]

The CPU 230 counts up the variable i by "1".

[Step S206]

The CPU 230 determines whether the variable i is less than "2X" or not.

If the CPU 230 determines that the variable i is less than "2X" (step S206, Yes), the CPU 230 repeats step S203.

[Step S207]

If the CPU 230 determines that the element num1[i] of the channel matrix is less than the element num0[i] (step S203, No), the CPU 230 determines whether the variable n is "−X" or "X".

[Step S208]

If the CPU 230 determines that the variable n is neither "−X" nor "X" (step S207, No), the CPU 230 sets the shift value Revshift to "n×dR".

[Step S209]

If the CPU 230 determines that the variable n is "−X" or "X" (step S207, Yes), or if the CPU 230 determines that the variable i is not less than "2X" (step S206, No), the shift value Revshift is set to be "None".

Here, referring back to FIG. 12, the subsequent process of the read operation will be described.

[Step S106]

The CPU 230 updates the shift value Shift for shifting the HB read voltage to "Shift+Revshift". Incidentally, the initial value of the shift value Shift is, for example, "0". Thus, for example, in step S101 of the first time, the HB read voltage is the voltage AR (0). However, when the shift value Shift was updated by step S106, the HB read operation is performed, in step S101 of the next and subsequent times, by using the voltage corresponding to the voltage AR (0)+shift value Shift. In addition, this shift value Shift is set, for example, on a block-by-block basis.

For example, when the NAND flash memory 10 is caused to execute step S101, the memory controller 20 supplies this shift value Shift to the NAND flash memory 10. Then, based on the received shift value Shift, the NAND flash memory 10 executes step S101. In addition, this shift value Shift may be stored in the register 104 or the like.

In this manner, with respect to each of the read levels, the CPU 230 successively compares the magnitudes of the first correct bit value and the second correct bit value, and can derive the read level at which the large/small relationship between the first correct bit value and the second correct bit value is reversed.

<1-2-4> Concrete Example

Referring to FIG. 16, a concrete example of the shift value Revshift deriving operation will be described.

A description is given based on the channel matrix illustrated in FIG. 14. In this example, the case in which the value X in FIG. 15 is "4" is described.

To start with, the CPU 230 determines whether the element num1[0] of the channel matrix is greater than the element num0[0] (FIG. 15, S203). As illustrated in FIG. 16, at index "111", the element num1[0] is "15996", and the element num0[0] is "0". Specifically, the element num1[0] is greater than the element num0[0].

The CPU 230 increments the variable i by "1" (S204 to S206). Incidentally, at this time point, the variable n is "−3". The CPU 230 determines whether the element num1[1] of the channel matrix is greater than the element num0[1] (S203). As illustrated in FIG. 16, at index "011", the element num1[1] is "806", and the element num0[1] is "0". Specifically, the element num1[1] is greater than the element num0[1].

The CPU 230 increments the variable i by "1" (S204 to S206). Incidentally, at this time point, the variable n is "−2". The CPU 230 determines whether the element num1[2] of the channel matrix is greater than the element num0[2] (S203). As illustrated in FIG. 16, at index "001", the element num1[2] is "456", and the element num0[2] is "0". Specifically, the element num1[2] is greater than the element num0[2].

The CPU 230 increments the variable i by "1" (S204 to S206). Incidentally, at this time point, the variable n is "−1". The CPU 230 determines whether the element num1[3] of the channel matrix is greater than the element num0[3] (S203). As illustrated in FIG. 16, at index "101", the element num1[3] is "199", and the element num0[3] is "2". Specifically, the element num1[3] is greater than the element num0[3].

The CPU 230 increments the variable i by "1" (S204 to S206). Incidentally, at this time point, the variable n is "0". The CPU 230 determines whether the element num1[4] of the channel matrix is greater than the element num0[4] (S203). As illustrated in FIG. 16, at index "100", the element num1[4] is "133", and the element num0[4] is "64". Specifically, the element num1[4] is greater than the element num0[4].

The CPU 230 increments the variable i by "1" (S204 to S206). Incidentally, at this time point, the variable n is "+1". The CPU 230 determines whether the element num1[5] of the channel matrix is greater than the element num0[5] (S203). As illustrated in FIG. 16, at index "000", the element num1[5] is "74", and the element num0[5] is "482". Specifically, the element num1[5] is less than the element num0[5].

It is understood that, at index "000" (voltage AR (+1) or more, and voltage AR (+2) or less), the distribution of the "Er" level is lower than the distribution of the "A" level. On the other hand, at index "100" (voltage AR (0) or more, and voltage AR (+1) or less), the distribution of the "Er" level was higher than the distribution of the "A" level. Specifically, it is understood that the read level AR (+1) is a voltage near the intersection between the distribution of the "Er" level and the distribution of the "A" level.

The CPU 230 determines that the element num1[5] of the channel matrix is less than the element num0[5] (step S204, No), and determines whether the variable n is "−4" or "4" (step S207).

Since the variable n is "+1", the CPU 230 determines that the variable n is neither "−4" nor "4" (step S207, No), and sets the shift value Revshift to "+1×dR".

The CPU 230 updates the shift value Shift for shifting the HB read voltage to "Shift+Revshift (+1×dR)".

In step S101 of the next and subsequent times in FIG. 12, the memory system 1 executes the HB read operation by using the voltage AR (+1) corresponding to the voltage AR (0)+shift value Shift (+1×dR). Thereby, the memory system 1 can execute the HB read operation at a position near the intersection between the distribution of the "Er" level and the distribution of the "A" level.

<1-3> Advantageous Effects

According to the above-described embodiment, the memory system 1 generates the channel matrix, based on the HB read operation and SB read operation, and derives the read voltage corresponding to the intersection between the threshold distributions by referring to the channel matrix.

In the Vth tracking described with reference to FIG. 6 to FIG. 11, the intersection of threshold distributions was determined by using the number of increase of on-cells as a criterion for determination. However, as described with reference to FIG. 9 to FIG. 11, there is a case in which the number of increase of on-cells becomes minimum at a position different from the intersection of the distributions, depending on the shape of the distributions. In this case, the position displaced from the intersection of the distributions would be set as the proper read voltage.

However, according to the above-described embodiment, by using the channel matrix, it is possible to determine, at each index, how many memory cells of the Er level or A level exist.

As a result, the intersection of distributions can be set as the proper read voltage. Thus, the number of read error bits can be minimized. Specifically, it is possible to prevent the number of error bits, which have occurred, from exceeding the number of bits which can be error-corrected by the ECC circuit 260. As a result, a high-quality memory system can be provided.

<2> Second Embodiment

A second embodiment will be described. In the second embodiment, a description is given of the case in which a memory cell transistor stores 2-bit data. In the meantime, the basic configuration and basic operation of the memory system of the second embodiment are the same as those of the memory system of the above-described first embodiment. Thus, a description is omitted of the matters which were described in the first embodiment, and matters which can be guessed from the first embodiment.

<2-1> Threshold Distributions of Memory Cell Transistors

Referring to FIG. 17, a description will be given of data and threshold distributions which the memory cell transistors according to this embodiment can take. The abscissa of FIG. 17 indicates a threshold voltage of memory cell transistors, and the ordinate indicates the number of memory cell transistors. Incidentally, the ordinate is on a log scale.

As illustrated in FIG. 17, each memory cell transistor can store data of 2 bits, in accordance with the threshold voltage thereof. The 2-bit data are referred to as "lower bits" and "higher bits". In addition, a set of lower bits, which the memory cells connected to the same word line store, is referred to as "lower page", and a set of higher bits is referred to as "upper page".

The 2-bit data are, for example, "11", "01", "00" and "10", in the order from the threshold voltage that is low.

The threshold of the memory cell transistor, which stores "11" data, is the "Er" level. The Er level is a threshold in a state in which a charge in the charge accumulation layer was drawn out and data was erased, and is either a positive value or a negative value (e.g. less than a voltage AR).

The data "01", "00" and "10" correspond to thresholds in the state in which a charge was injected in the charge accumulation layer and data was written. The threshold of the memory cell, which stores "01" data, is an "A" level which is higher than the Er level (e.g. voltage AR or more, and less than BR; AR<BR).

The threshold of the memory cell, which stores "00" data, is a "B" level which is higher than the A level (e.g. voltage BR or more, and less than CR; BR<CR). The threshold of the memory cell, which stores "10" data, is a "C" level which is higher than the B level (e.g. voltage CR or more).

Needless to say, the relationship between the 2-bit data and thresholds is not limited to this relationship. For example, there may be such a case that the "11" data corresponds to the "C" level, and the relationship therebetween can properly be selected.

By a voltage BR being applied to a selected word line, the data of the lower bits can be read. By voltages AR and CR being applied to a selected word line, the data of the higher bits can be read.

In addition, as described in the first embodiment, in the memory cell transistor, due to various factors, the threshold voltage of memory cell transistor may vary, as illustrated in FIG. 18. As a result, in some cases, neighboring distributions overlap. In this manner, due to such a displacement of distributions, an error would occur.

<2-2> Operation

<2-2-1> Outline of Read Operation

Here, the outline of the read operation will be described.

The read operation to be described in this embodiment is generally classified into lower read for reading lower bits, and upper read for reading higher bits.

<2-2-1-1> Outline of Lower Read Operation

Figure 19:
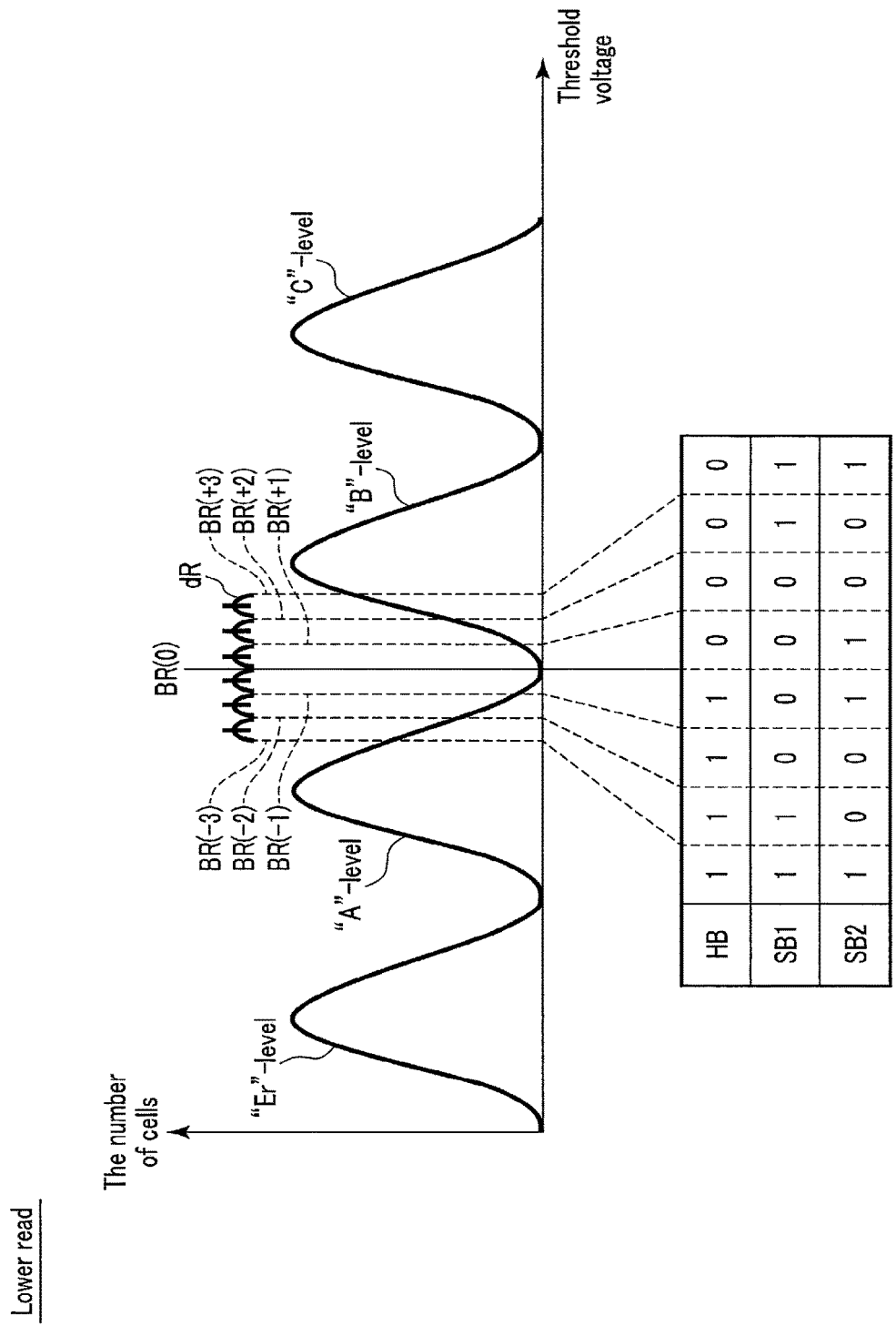
FIG. 19 is a view illustrating a relationship between threshold distributions of memory cell transistors of the memory system and stored data of lower bits according to the second embodiment.

The lower read operation to be described in this embodiment is generally classified into an HB read operation and an SB read operation. As illustrated in FIG. 19, in the HB read operation, the control circuit 103 applies a voltage for HB read (here, voltage BR (0)) to a selected word line. Thereby, since the control circuit 103 can determine the threshold voltage of the memory cell transistor, the control circuit 103 can read HB data.

When hard-decision decoding failed, an SB read operation is performed in order to execute soft-decision decoding with higher error correction capability. As illustrated in FIG. 19, in the SB read operation, the control circuit 103 applies, as needed, a plurality of SB read voltages (here, voltages BR (−3) to BR (−1), and BR (+1) to BR (+3)) to the memory cell transistor. Incidentally, the number of SB read voltages is not limited to three on each of the low voltage side and high voltage side of the HB read voltage, as illustrated in FIG. 19. In addition, the voltages BR (−3) to BR (+3) are set at intervals of a voltage dR.

As illustrated in FIG. 19, a hard-decision bit ("HB" in FIG. 19) can be obtained by a result of an HB read operation using the voltage BR (0). A first soft-decision bit ("SB1" in FIG. 19) can be obtained by an ENOR operation of SB read operation results using the voltages BR (−2) and BR (+2). A second soft-decision bit ("SB2" in FIG. 19) can be obtained by an ENOR operation of SB read operation results using the voltages BR (−3), BR (−1), BR (+1) and BR (+3).

The three bits of "SB2", "SB1" and "HB" are used as indices which indicate corresponding read levels.

<2-2-1-2> Outline of Upper Read Operation

Figure 20:
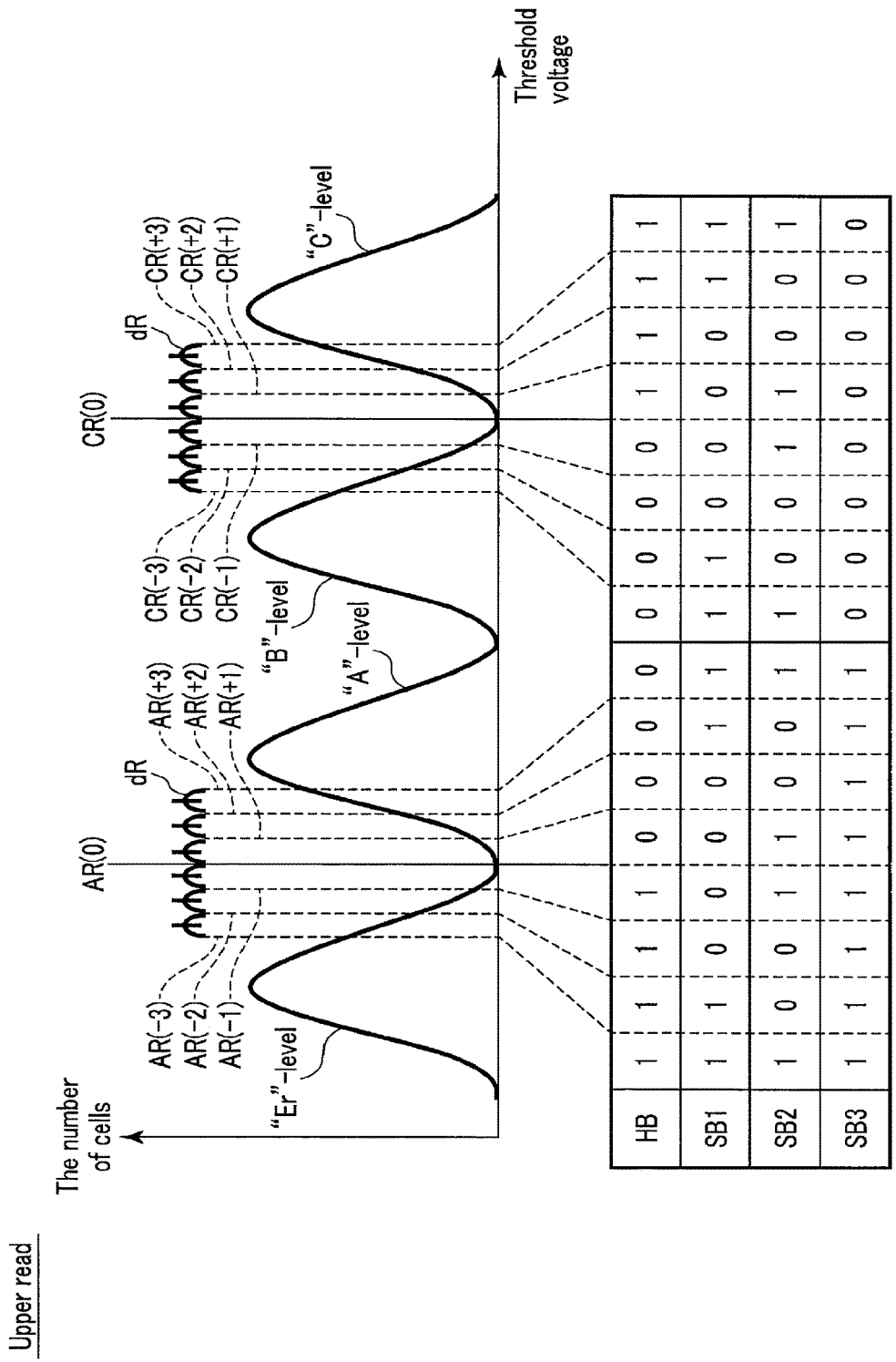
FIG. 20 is a view illustrating a relationship between threshold distributions of memory cell transistors of the memory system and stored data of higher bits according to the second embodiment.
Figure 21:
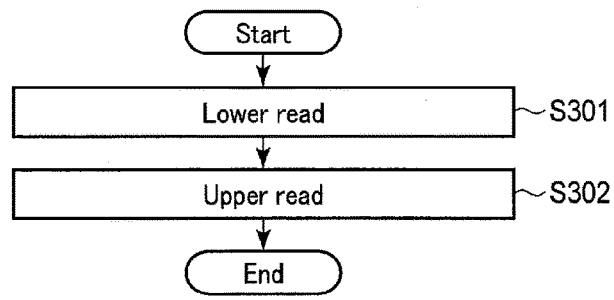
FIG. 21 is a flowchart illustrating a read operation according to the second embodiment.

The upper read operation to be described in this embodiment is generally classified into an HE read operation and an SB read operation. As illustrated in FIG. 20, in the HB read operation, the control circuit 103 applies a voltage for HB read (here, voltages AR (0) and CR (0)) to a selected word line. Thereby, since the control circuit 103 can determine the threshold voltage of the memory cell transistor, the control circuit 103 can read HE data.

When hard-decision decoding failed, an SB read operation is performed in order to execute soft-decision decoding with higher error correction capability. As illustrated in FIG. 20, in the SB read operation, the control circuit 103 applies, as needed, a plurality of SB read voltages (here, voltages AR (−3)~AR (−1), AR (+)~AR (+3), CR (−3)~CR (−1), and CR (+1) to CR (+3)). Incidentally, the number of SB read voltages is not limited to three on each of the low voltage side and high voltage side of the HB read voltage, as illustrated in FIG. 20. In addition, the voltages AR (−3) to AR (+3) are set at intervals of a voltage dR. Besides, the voltages CR (−3) to CR (+3) are set at intervals of a voltage dR.

As illustrated in FIG. 20, a hard-decision bit ("HB" in FIG. 20) can be obtained by an ENOR operation of HB read operation results using the voltages AR (0) and CR (0). A first soft-decision bit ("SB1" in FIG. 20) can be obtained by an ENOR operation of SB read operation results using the voltages AR (−2), AR (+2), CR (−2) and CR (+2). A second soft-decision bit ("SB2" in FIG. 20) can be obtained by an ENOR operation of SB read operation results using the voltages AR (−3), AR (−1), AR (+1), AR (+3), CR (−3), CR (−1), CR (+1) and CR (+3). A third soft-decision bit ("SB3" in FIG. 20) can be obtained by a lower read operation result using the voltage BR (0)

The four bits of "SB3", "SB2", "SB1" and "HB" are used as indices which indicate corresponding read levels.

<2-2-2> Read Operation According to the Present Embodiment

Referring to FIG. 12, read operation according to the present embodiment is described.

[Step S301]

To begin with, the memory controller 20 executes a lower read operation.

[Step S302]

If the lower read operation is completed, the memory controller 20 executes an upper read operation.

Figure 22:
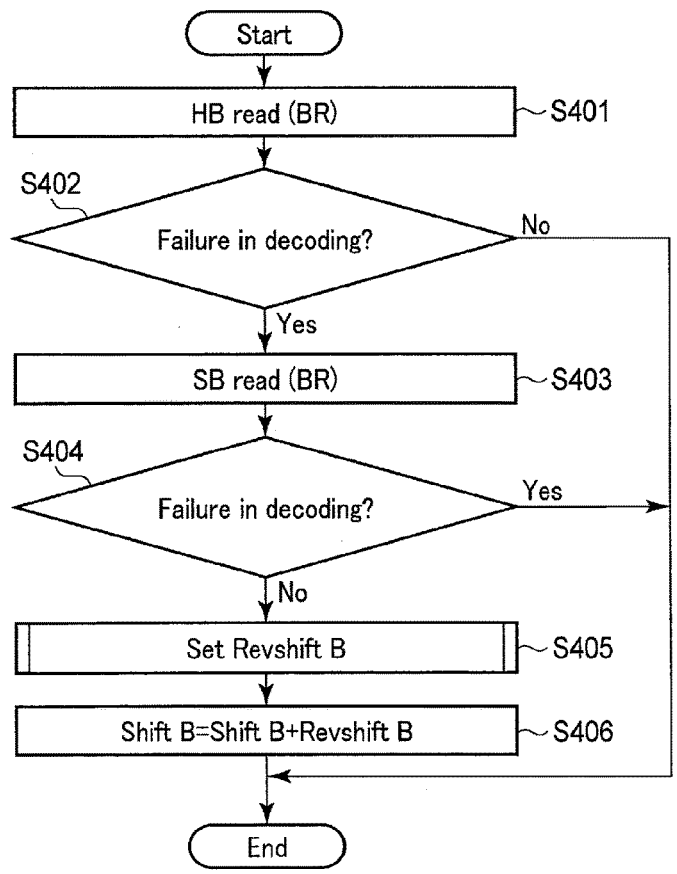
FIG. 22 is a flowchart illustrating the read operation according to the second embodiment.

Referring to FIG. 22, the lower read operation of step S301 is described.

[Step S401]

The memory controller 20 issues a third read command, and the NAND flash memory 10 reads lower page data in response to this third read command. Incidentally, this read operation is an HB read operation of the lower page.

Upon receiving the third read command, the NAND flash memory 10 reads HB data by using the read voltage BR (n) for HB read of the lower page. In addition, the NAND flash memory 10 sends the read HB data of the lower page to the memory controller 20.

[Step S402]

The ECC circuit 260 executes an ECC process (hard-decision decoding process) with respect to the received HE data of the lower page. If the ECC circuit 260 successfully corrects an error of the HB data of the lower page by the ECC process (hard-decision decoding process) (step S402, No), the lower page read operation is terminated (step S301).

[Step S403]

If the ECC circuit 260 fails to correct an error of the HB data of the lower page by the ECC process (hard-decision decoding process) (step S402, Yes), the memory controller 20 issues a fourth read command which is different from the third read command. Responding to this fourth read command, the NAND flash memory 10 reads lower page data. Incidentally, this read operation is an SB read operation of the lower page.

Upon receiving the fourth read command, the NAND flash memory 10 reads SB data by using a plurality of read voltages BR for SB read of the lower page.

Specifically, the control circuit 103 executes the SB read operation by using the voltage BR (−1), voltage BR (−2), voltage BR (−3), voltage BR (+1), voltage BR (+2) and voltage BR (+3), which are shifted to the minus side and plus side in units of a voltage dR from the voltage BR (n ("0" in this example)) that is used at the time of the HB read operation of the lower page.

Then, the NAND flash memory 10 sends the SB data of the lower page, which was obtained by the SB read operation of the lower page, to the memory controller 20.

[Step S404]

Based on the received SB data of the lower page, the ECC circuit 260 executes an ECC process (soft-decision decoding process). In addition, based on the result of the ECC process (soft-decision decoding process), the ECC circuit 260 finally determines the read data. If the ECC circuit 260 fails to correct an error by the ECC process (soft-decision decoding process) (step S404, Yes), the memory controller 20 terminates the read operation.

Hereinafter, the operation of the channel matrix generator 263 at the time of the ECC process (soft-decision decoding process) will be described. The channel matrix generator 263 detects a correct bit value (written lower bit value) and a read level (or index) with respect to each of bits that form an input frame. The channel matrix generator 263 generates a channel matrix by counting the number of occurrences of the combination between the correct bit value and the read level.

Specifically, the channel matrix generator 263 can generate a channel matrix, for example, as illustrated in FIG. 13. The size of the matrix of FIG. 13 is 2 rows×8 columns. Incidentally, the size of the matrix is not limited to this. For example, if a channel matrix of lower bits is actually generated, a channel matrix as illustrated in FIG. 14 is generated. In the present embodiment, this channel matrix is used when the voltage BR (n) for the HB read operation of the lower page is derived, as will be described later.

The CPU 230 generates an LLR table relating to the lower page, based on the generated channel matrix of the lower page. The CPU 230 sets the generated LLR table relating to the lower page in the decoder 262, as needed.

[Step S405]

If the ECC circuit 260 successfully corrects an error by the ECC process (soft-decision decoding process) (step S404, No), the memory controller 20 derives a shift value Revshift B of a proper voltage for adjusting the voltage BR (n) for the HB read operation.

Figure 23:
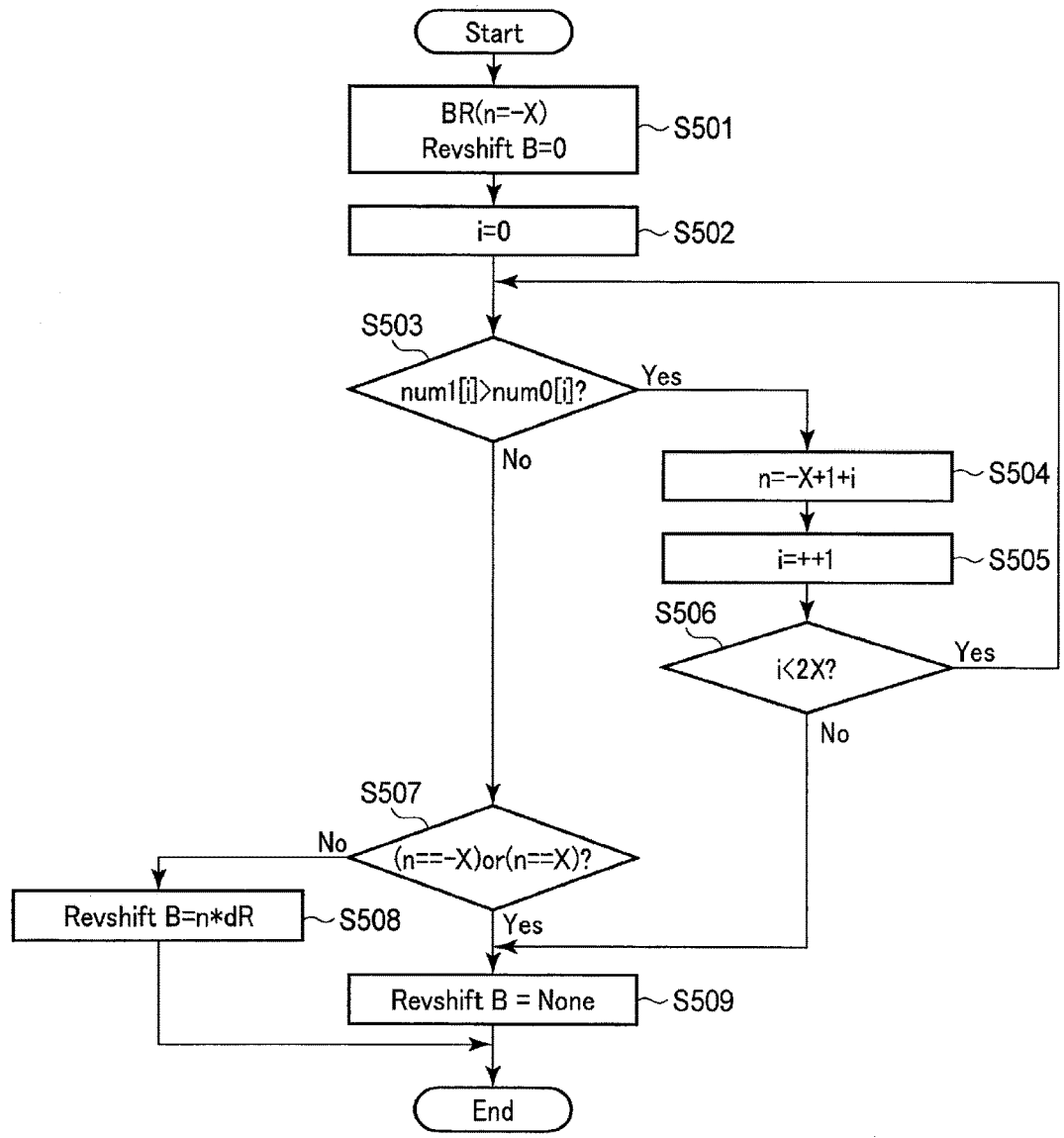
FIG. 23 is a flowchart illustrating the read operation according to the second embodiment.

Referring to FIG. 23, a description is given of a method of deriving the shift value Revshift B with use of the channel matrix.

[Step S501]

The CPU 230 first sets a variable n of the voltage BR (n) at "−X", and sets the shift value Revshift B at the initial (here, 0). The value "X" is an arbitrary integer, and is a value which is obtained by subtracting "1" from "−m" relating to a minimum read voltage BR (−m (m is a positive integer)) among a plurality of SB read voltages. In addition, the value "X" is a value which is obtained by adding "1" to "m" relating to a maximum read voltage BR (m) among the plural SB read voltages.

[Step S502]

Subsequently, the CPU 230 sets a variable i at the initial value (here, 0).

[Step S503]

The CPU 230 determines whether an element num1[i] of the channel matrix is greater than an element num0[i].

If the element num1[i] of the channel matrix is greater than the element num0[1], it turns out that the distribution of the A level exists above the distribution of the B level. Conversely, if the element num[i] of the channel matrix is not greater than the element num0[i], it turns out that the distribution of the A level exists below the distribution of the B level. Specifically, in this embodiment, the CPU 230 derives a position at which the large/small relationship between the element num1[i] of the channel matrix and the element num0[i] is reversed. Thereby, the CPU 230 can estimate the intersection between the distribution of the A level and the distribution of the B level.

[Step S504]

If the CPU 230 determines that the element num1[i] of the channel matrix is greater than the element num0[i] (step S503, Yes), the CPU 230 updates the variable n to "−X+1+i".

[Step S505]

The CPU 230 counts up the variable i by "1".

[Step S506]

The CPU 230 determines whether the variable i is less than "2X" or not.

If the CPU 230 determines that the variable i is less than "2X" (step S506, Yes), the CPU 230 repeats step S503.

[Step S507]

If the CPU 230 determines that the element num1[i] of the channel matrix is less than the element num1[i] (step S503, No), the CPU 230 determines whether the variable n is "−X" or "X".

[Step S508]

If the CPU 230 determines that the variable n is neither "−X" nor "X" (step S507, No), the CPU 230 sets the shift value Revshift B to "n×dR".

[Step S509]

If the CPU 230 determines that the variable n is "−X" or "X" (step S507, Yes), or if the CPU 230 determines that the variable i is not less than "2X" (step S506, No), the shift value Revshift B is set to be "None".

Here, referring back to FIG. 22, the subsequent process of the read operation of the lower page will be described.

[Step S406]

The CPU 230 updates the shift value Shift B for shifting the HB read voltage of the lower page to "Shift B+Revshift B". Incidentally, the initial value of the shift value Shift B is, for example, "0". Thus, for example, in step S401 of the first time, the HB read voltage of the lower page is the voltage BR (0). However, when the shift value Shift B was updated by step S506, the HB read operation of the lower page is performed, in step S401 of the next and subsequent times, by using the voltage corresponding to the voltage BR (0)+shift value Shift B. In addition, this shift value Shift B is set, for example, on a block-by-block basis.

Figure 24:
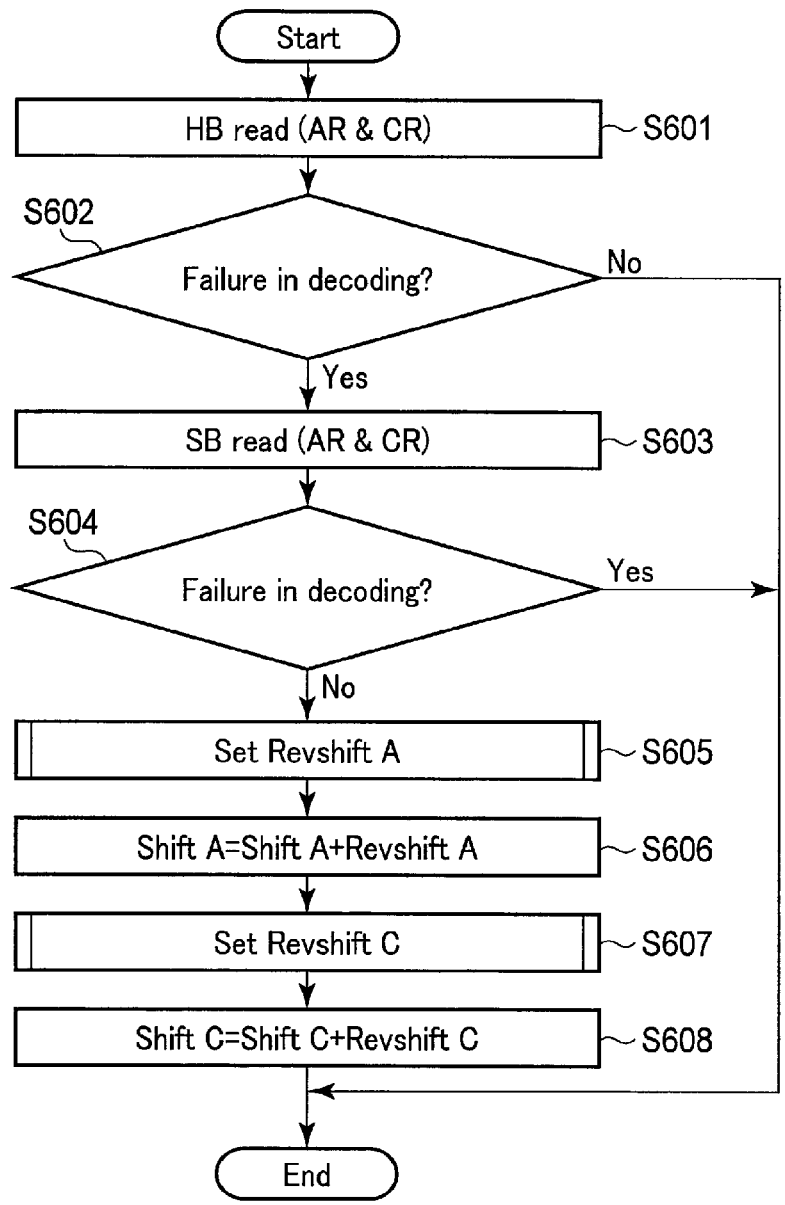
FIG. 24 is a flowchart illustrating the read operation according to the second embodiment.

Referring to FIG. 24, the upper read operation of step S302 is described.

[Step S601]

The memory controller 20 issues a fifth read command, and the NAND flash memory 10 reads upper page data in response to this fifth read command. Incidentally, this read operation is an HB read operation of the upper page.

Upon receiving the fifth read command, the NAND flash memory 10 reads HB data by using the read voltage AR (n), CR (n) for HB read of the upper page. In addition, the NAND flash memory 10 sends the read HB data of the upper page to the memory controller 20.

[Step S602]

The ECC circuit 260 executes an ECC process (hard-decision decoding process) with respect to the received HB data of the upper page. If the ECC circuit 260 successfully corrects an error of the HB data of the upper page by the ECC process (hard-decision decoding process) (step S602, No), the upper page read operation is terminated (step S302).

[Step S603]

If the ECC circuit 260 fails to correct an error of the HB data of the upper page by the ECC process (hard-decision decoding process) (step S602, Yes), the memory controller 20 issues a sixth read command which is different from the fifth read command. Responding to this sixth read command, the NAND flash memory 10 reads upper page data. Incidentally, this read operation is an SB read operation of the upper page.

Upon receiving the sixth read command, the NAND flash memory 10 reads SB data by using a plurality of read voltages AR and CR for SB read of the upper page.

Specifically, the control circuit 103 executes the SB read operation by using the voltage AR (−1), voltage AR (−2), voltage AR (−3), voltage AR (+1), voltage AR (+2) and voltage AR (+3), which are shifted to the minus side and plus side in units of a voltage dR from the voltage AR (n ("0" in this example)) that is used at the time of the HB read operation of the upper page, as well as using the voltage CR (−1), voltage CR (−2), voltage CR (−3), voltage CR (+1), voltage CR (+2) and voltage CR (+3), which are shifted to the minus side and plus side in units of a voltage dR from the voltage CR (n).

Then, the NAND flash memory 10 sends the SB data of the upper page, which was obtained by the SB read operation of the upper page, to the memory controller 20.

[Step S604]

Based on the received SB data of the upper page, the ECC circuit 260 executes an ECC process (soft-decision decoding process). In addition, based on the result of the ECC process (soft-decision decoding process), the ECC circuit 260 finally determines the read data. If the ECC circuit 260 fails to correct an error by the ECC process (soft-decision decoding process) (step S604, Yes), the memory controller 20 terminates the read operation.

Hereinafter, the operation of the channel matrix generator 263 at the time of the ECC process (soft-decision decoding process) will be described. The channel matrix generator 263 detects a correct bit value (written higher bit value) and a read level (or index) with respect to each of bits that form an input frame. The channel matrix generator 263 generates a channel matrix by counting the number of occurrences of the combination between the correct bit value and the read level.

Specifically, the channel matrix generator 263 can generate a channel matrix, for example, as illustrated in FIG. 25, FIG. 26. The size of the matrix of FIG. 25, FIG. 16 is 2 rows×8 columns. Incidentally, the size of the matrix is not limited to this. For example, if a channel matrix of lower bits is actually generated, a channel matrix as illustrated in FIG. 27, FIG. 28 is generated. In the present embodiment, this channel matrix is used when the voltage AR (n), CR (n) for the HB read operation of the upper page is derived, as will be described later.

The CPU 230 generates an LLR table relating to the upper page, based on the channel matrix of the upper page. The CPU 230 sets the generated LLR table relating to the upper page in the decoder 262, as needed.

[Step S605]

If the ECC circuit 260 successfully corrects an error by the ECC process (soft-decision decoding process) (step S604, No), the memory controller 20 derives a shift value Revshift A, Revshift B of a proper voltage for adjusting the voltage AR (n), CR (n) for the HB read operation.

Referring to FIG. 29, a description is given of a method of deriving the shift value Revshift A with use of the channel matrix.

[Step S701]

The CPU 230 first sets a variable n of the voltage AR (n) at "−X", and sets the shift value Revshift A at the initial value (here, 0). The value "X" is an arbitrary integer, and is a value which is obtained by subtracting "1" from "−m" relating to a minimum read voltage AR (−m (m is a positive integer)) among a plurality of SB read voltages. In addition, the value "X" is a value which is obtained by adding "1" to "m" relating to a maximum read voltage AR (m) among the plural SB read voltages.

[Step S702]

Subsequently, the CPU 230 sets a variable i at the initial value (here, 0).

[Step S703]

The CPU 230 determines whether an element num1[i] of the channel matrix is greater than an element num0[i].

If the element num1[i] of the channel matrix is greater than the element num0[i], it turns out that the distribution of the Er level exists above the distribution of the A level. Conversely, if the element num1[i] of the channel matrix is not greater than the element num0[1], it turns out that the distribution of the Er level exists below the distribution of the A level. Specifically, in this embodiment, the CPU 230 derives a position at which the large/small relationship between the element num1[i] of the channel matrix and the element num0[i] is reversed. Thereby, the CPU 230 can estimate the intersection between the distribution of the Er level and the distribution of the A level.

[Step S704]

If the CPU 230 determines that the element num1[i] of the channel matrix is greater than the element num0[i] (step S703, Yes), the CPU 230 updates the variable n to "−X+1+i".

[Step S705]

The CPU 230 counts up the variable i by "1".

[Step S706]

The CPU 230 determines whether the variable i is less than "2X" or not.

If the CPU 230 determines that the variable i is less than "2X" (step S706, Yes), the CPU 230 repeats step S703.

[Step S707]

If the CPU 230 determines that the element num1[i] of the channel matrix is less than the element num0[i] (step S703, No), the CPU 230 determines whether the variable n is "−X" or "X".

[Step S708]

If the CPU 230 determines that the variable n is neither "−X" nor "X" (step S707, No), the CPU 230 sets the shift value Revshift A to "n×dR".

[Step S709]

If the CPU 230 determines that the variable n is "−X" or "X" (step S707, Yes), or if the CPU 230 determines that the variable i is not less than "2X" (step S706, No), the shift value Revshift A is set to be "None".

Referring to FIG. 30, a description is given of a method of deriving the shift value Revshift C with use of the channel matrix.

[Step S801]

The CPU 230 first sets a variable n of the voltage CR (n) at "−X", and sets the shift value Revshift C at the initial value (here, 0). The value "X" is an arbitrary integer, and is a value which is obtained by subtracting "1" from "−m" relating to a minimum read voltage CR (−m (m is a positive integer)) among a plurality of SB read voltages. In addition, the value "X" is a value which is obtained by adding "1" to "m" relating to a maximum read voltage CR (m) among the plural SB read voltages.

[Step S802]

Subsequently, the CPU 230 sets a variable i at the initial value (here, 0).

[Step S803]

The CPU 230 determines whether an element num1[i] of the channel matrix is greater than an element num0[1].

If the element num1[i] of the channel matrix is greater than the element num0[1], it turns out that the distribution of the B level exists above the distribution of the C level. Conversely, if the element num1[i] of the channel matrix is not greater than the element num0[1], it turns out that the distribution of the B level exists below the distribution of the C level. Specifically, in this embodiment, the CPU 230 derives a position at which the large/small relationship between the element num1[i] of the channel matrix and the element num0[i] is reversed. Thereby, the CPU 230 can estimate the intersection between the distribution of the B level and the distribution of the C level.

[Step S804]

If the CPU 230 determines that the element num1[i] of the channel matrix is greater than the element num0[i] (step S803, Yes), the CPU 230 updates the variable n to "−X+1+i".

[Step S805]

The CPU 230 counts up the variable i by "1".

[Step S806]

The CPU 230 determines whether the variable i is less than "2X" or not.

If the CPU 230 determines that the variable i is less than "2X" (step S806, Yes), the CPU 230 repeats step S803.

[Step S807]

If the CPU 230 determines that the element num1[i] of the channel matrix is less than the element num0[i] (step S803, No), the CPU 230 determines whether the variable n is "−X" or "X".

[Step S808]

If the CPU 230 determines that the variable n is neither "−X" nor "X" (step S807, No), the CPU 230 sets the shift value Revshift C to "n×dR".

[Step S809]

If the CPU 230 determines that the variable n is "−X" or "X" (step S807, Yes), or if the CPU 230 determines that the variable i is not less than "2X" (step S806, No), the shift value Revshift C is set to be "None".

Here, referring back to FIG. 24, the subsequent process of the read operation of the upper page will be described.

[Step S606]

The CPU 230 updates the shift value Shift A for shifting the HB read voltage of the upper page to "Shift A+Revshift A". In addition, the CPU 230 updates the shift value Shift C for shifting the HB read voltage of the upper page to "Shift C+Revshift C". Incidentally, the initial values of the shift values Shift A and Shift C are, for example, "0". Thus, for example, in step S601 of the first time, the HB read voltages of the upper page are the voltage AR (0) and CR (0). However, when the shift value Shift A was updated by step S706, the HB read operation of the upper page is performed, in step S601 of the next and subsequent times, by using the voltage corresponding to the voltage AR (0)+shift value Shift A. In addition, this shift value Shift A is set, for example, on a block-by-block basis. Besides, when the shift value Shift C was updated by step S806, the HB read operation of the upper page is performed, in step S601 of the next and subsequent times, by using the voltage corresponding to the voltage CR (0)+shift value Shift C. In addition, this shift value Shift C is set, for example, on a block-by-block basis.

<2-2-3> Concrete Examples

<2-2-3-1> Concrete Example of Shift Value Revshift B Deriving Operation

Referring to FIG. 31, a concrete example of the shift value Revshift B deriving operation will be described.

A description is given based on the channel matrix illustrated in FIG. 14. In this example, the case in which the value X in FIG. 23 is "4" is described.

To start with, the CPU 230 determines whether the element num1[0] of the channel matrix is greater than the element num0[0] (FIG. 23, S503). As illustrated in FIG. 31, at index "111", the element num1[0] is "15996", and the element num0[0] is "0". Specifically, the element num1[0] is greater than the element num0[0].

The CPU 230 increments the variable i by "1" (S504 to S506). Incidentally, at this time point, the variable n is "−3". The CPU 230 determines whether the element num1[1] of the channel matrix is greater than the element num0[1] (S503). As illustrated in FIG. 31, at index "011", the element num1[1] is "806", and the element num0[1] is "0". Specifically, the element num1[1] is greater than the element num0[1].

The CPU 230 increments the variable i by "1" (S504 to S506). Incidentally, at this time point, the variable n is "−2". The CPU 230 determines whether the element num1[2] of the channel matrix is greater than the element num0[2] (S503). As illustrated in FIG. 31, at index "001", the element num1[2] is "456", and the element num0[2] is "0". Specifically, the element num1[2] is greater than the element num0[2].

The CPU 230 increments the variable i by "1" (S504 to S506). Incidentally, at this time point, the variable n is "−1". The CPU 230 determines whether the element num1[3] of the channel matrix is greater than the element num0[3] (S503). As illustrated in FIG. 31, at index "101", the element num1[3] is "199", and the element num0[3] is "2". Specifically, the element num1[3] is greater than the element num0[3].

The CPU 230 increments the variable i by "1" (S504 to S506). Incidentally, at this time point, the variable n is "0". The CPU 230 determines whether the element num1[4] of the channel matrix is greater than the element num0[4] (S503). As illustrated in FIG. 31, at index "100", the element num1[4] is "133", and the element num0[4] is "64". Specifically, the element num1[4] is greater than the element num0[4].

The CPU 230 increments the variable i by "1" (S504 to S506). Incidentally, at this time point, the variable n is "+1". The CPU 230 determines whether the element num1[5] of the channel matrix is greater than the element num0[5] (S503). As illustrated in FIG. 31, at index "000", the element num1[5] is "74", and the element num0[5] is "482". Specifically, the element num1[5] is less than the element num0[5].

It is understood that, at index "000" (voltage BR (+1) or more, and voltage BR (+2) or less), the distribution of the "A" level is lower than the distribution of the "B" level. On the other hand, at index "100" (voltage BR (0) or more, and voltage BR (+1) or less), the distribution of the "A" level was higher than the distribution of the "B" level. Specifically, it is understood that the read level BR (+1) is a voltage near the intersection between the distribution of the "A" level and the distribution of the "B" level.

The CPU 230 determines that the element num1[5] of the channel matrix is less than the element num0[5] (step S504, No), and determines whether the variable n is "−4" or "4" (step S507).

Since the variable n is "+1", the CPU 230 determines that the variable n is neither "−4" nor "4" (step S507, No), and sets the shift value Revshift B to "+1×dR".

The CPU 230 updates the shift value Shift B for shifting the HB read voltage to "Shift B+Revshift B (+1×dR)".

In step S401 of the next and subsequent times in FIG. 22, the memory system 1 executes the HB read operation by using the voltage BR (+1) corresponding to the voltage BR (0)+shift value Shift B (+1×dR). Thereby, the memory system 1 can execute the HE read operation at a position near the intersection between the distribution of the "A" level and the distribution of the "B" level.

<2-2-3-2> Concrete Example of Shift Value Revshift a Deriving Operation

Referring to FIG. 32, a concrete example of the shift value Revshift A deriving operation will be described.

A description is given based on the channel matrix illustrated in FIG. 27. In this example, the case in which the value X in FIG. 29 is "4" is described.

To start with, the CPU 230 determines whether the element num1[0] of the channel matrix is greater than the element num0[0] (FIG. 29, S703). As illustrated in FIG. 32, at index "1111", the element num1[0] is "7535", and the element num0[0] is "0". Specifically, the element num1[0] is greater than the element num0[0].

The CPU 230 increments the variable i by "1" (S704 to S706). Incidentally, at this time point, the variable n is "−3". The CPU 230 determines whether the element num1[1] of the channel matrix is greater than the element num0[1] (S703). As illustrated in FIG. 32, at index "1011", the element num1[1] is "556", and the element num0[1] is "0". Specifically, the element num1[1] is greater than the element num0[1].

The CPU 230 increments the variable i by "1" (S704 to S706). Incidentally, at this time point, the variable n is "−2". The CPU 230 determines whether the element num1[2] of the channel matrix is greater than the element num0[2] (S703). As illustrated in FIG. 32, at index "1001", the element num1[2] is "299", and the element num0[2] is "0". Specifically, the element num1[2] is greater than the element num0[2].

The CPU 230 increments the variable i by "1" (S704 to S706). Incidentally, at this time point, the variable n is "−1". The CPU 230 determines whether the element num1[3] of the channel matrix is greater than the element num0[3] (S703). As illustrated in FIG. 32, at index "1101", the element num1[3] is "164", and the element num0[3] is "2". Specifically, the element num1[3] is greater than the element num0[3].

The CPU 230 increments the variable i by "1" (S704 to S706). Incidentally, at this time point, the variable n is "0". The CPU 230 determines whether the element num1[4] of the channel matrix is greater than the element num0[4] (S703). As illustrated in FIG. 32, at index "1100", the element num1[4] is "76", and the element num0[4] is "10". Specifically, the element num1[4] is greater than the element num0[4].

The CPU 230 increments the variable i by "1" (S704 to S706). Incidentally, at this time point, the variable n is "+1". The CPU 230 determines whether the element num1[5] of the channel matrix is greater than the element num0[5] (S703). As illustrated in FIG. 32, at index "1000", the element num1[5] is "41", and the element num0[5] is "56". Specifically, the element num1[5] is less than the element num0[5].

It is understood that, at index "1000" (voltage AR (+1) or more, and voltage AR (+2) or less), the distribution of the "Er" level is lower than the distribution of the "A" level. On the other hand, at index "1100" (voltage AR (0) or more, and voltage AR (+1) or less), the distribution of the "Er" level was higher than the distribution of the "A" level. Specifically, it is understood that the read level AR (+1) is a voltage near the intersection between the distribution of the "Er" level and the distribution of the "A" level.

The CPU 230 determines that the element num1[5] of the channel matrix is less than the element num0[5] (step S704, No), and determines whether the variable n is "−4" or "4" (step S707).

Since the variable n is "+1", the CPU 230 determines that the variable n is neither "−4" nor "4" (step S707, No), and sets the shift value Revshift A to "+1×dR".

The CPU 230 updates the shift value Shift A for shifting the HB read voltage to "Shift A+Revshift A (+1×dR)".

In step S601 of the next and subsequent times in FIG. 24, the memory system 1 executes the HB read operation by using the voltage AR (+1) corresponding to the voltage AR (0)+shift value Shift A (+1×dR). Thereby, the memory system 1 can execute the HB read operation at a position near the intersection between the distribution of the "Er" level and the distribution of the "A" level.

<2-2-3-3> Concrete Example of Shift Value Revshift C Deriving Operation

Referring to FIG. 33, a concrete example of the shift value Revshift C deriving operation will be described.

A description is given based on the channel matrix illustrated in FIG. 28. In this example, the case in which the value X in FIG. 30 is "4" is described.

To start with, the CPU 230 determines whether the element num1[0] of the channel matrix is greater than the element num0[0] (FIG. 30, S803). As illustrated in FIG. 33, at index "0110", the element num1[0] is "9", and the element num0[0] is "8628". Specifically, the element num1

[0] is less than the element num0[0]. In other words, it is understood that at index "0110" (voltage CR (−3) or less), the distribution of the "B" level is higher than the distribution of the "C" level.

The CPU 230 increments the variable i by "1" (S804 to S806). Incidentally, at this time point, the variable n is "−3". The CPU 230 determines whether the element num1[1] of the channel matrix is less than the element num0[1] (S803). As illustrated in FIG. 33, at index "0010", the element num1[1] is "0", and the element num0[1] is "170". Specifically, the element num1[1] is less than the element num0[1]. In other words, it is understood that at index "0010" (voltage CR (−3) or more, and voltage CR (−2) or less), the distribution of the "B" level is higher than the distribution of the "C" level.

The CPU 230 increments the variable i by "1" (S804 to S806). Incidentally, at this time point, the variable n is "−2". The CPU 230 determines whether the element num1[2] of the channel matrix is less than the element num0[2] (S803). As illustrated in FIG. 33, at index "0000", the element num1[2] is "8", and the element num0[2] is "39". Specifically, the element num1[2] is less than the element num0[2]. In other words, it is understood that at index "0000" (voltage CR (−2) or more, and voltage CR (−1) or less), the distribution of the "B" level is higher than the distribution of the "C" level.

The CPU 230 increments the variable i by "1" (S804 to S806). Incidentally, at this time point, the variable n is "−1". The CPU 230 determines whether the element num1[3] of the channel matrix is less than the element num0[3] (S803). As illustrated in FIG. 33, at index "0100", the element num1[3] is "14", and the element num0[3] is "13". Specifically, the element num1[3] is greater than the element num0[3].

It is understood that, at index "0100" (voltage CR (−1) or more, and voltage CR (0) or less), the distribution of the "B" level is lower than the distribution of the "C" level. On the other hand, at index "0000" (voltage CR (−2) or more, and voltage CR (−1) or less), the distribution of the "B" level was higher than the distribution of the "C" level. Specifically, it is understood that the read level CR (−1) is a voltage near the intersection between the distribution of the "B" level and the distribution of the "C" level.

The CPU 230 determines that the element num1[3] of the channel matrix is greater than the element num0[3] (step S804, No), and determines whether the variable n is "−4" or "4" (step S807).

Since the variable n is "−1", the CPU 230 determines that the variable n is neither "−4" nor "4" (step S807, No), and sets the shift value Revshift C to "−1×dR".

The CPU 230 updates the shift value Shift C for shifting the HB read voltage to "Shift C+Revshift C (−1×dR)".

In step S601 of the next and subsequent times in FIG. 24, the memory system 1 executes the HB read operation by using the voltage AR (−1) corresponding to the voltage CR (0)+shift value Shift C (−1×dR). Thereby, the memory system 1 can execute the HB read operation at a position near the intersection between the distribution of the "B" level and the distribution of the "C" level.

<2-3> Advantageous Effects

According to the above-described embodiment, the memory system generates the channel matrix with respect to each of the lower bits and higher bits, based on the HB read operation and SB read operation, and derives the read voltage corresponding to the intersection between the threshold distributions by referring to the channel matrix. Therefore, the same advantageous effects as in the first embodiment can be obtained.

<3> Third Embodiment

A third embodiment will be described. In the third embodiment, a description is given of a method of deriving a proper shift value by calculating the number of fail bits in the channel matrix. In the meantime, the basic configuration and basic operation of the memory system of the third embodiment are the same as those of the memory systems of the above-described first and second embodiments. Thus, a description is omitted of the matters which were described in the first and second embodiments, and matters which can be guessed from the first and second embodiments.

<3-1> Outline of Operation

In the present embodiment, a read level, at which the number of fail bits becomes minimum, is derived by using the channel matrix. Thereby, the read level can be derived.

<3-1-1> Operation Example 1

To begin with, an operation example 1 of the memory system according to this embodiment is described.

The operation example 1 is an example which can be substituted for step S105 of FIG. 12 described in the first embodiment, step S405 of FIG. 22 described in the second embodiment, and step S605 of FIG. 24 described in the second embodiment.

Figure 34:
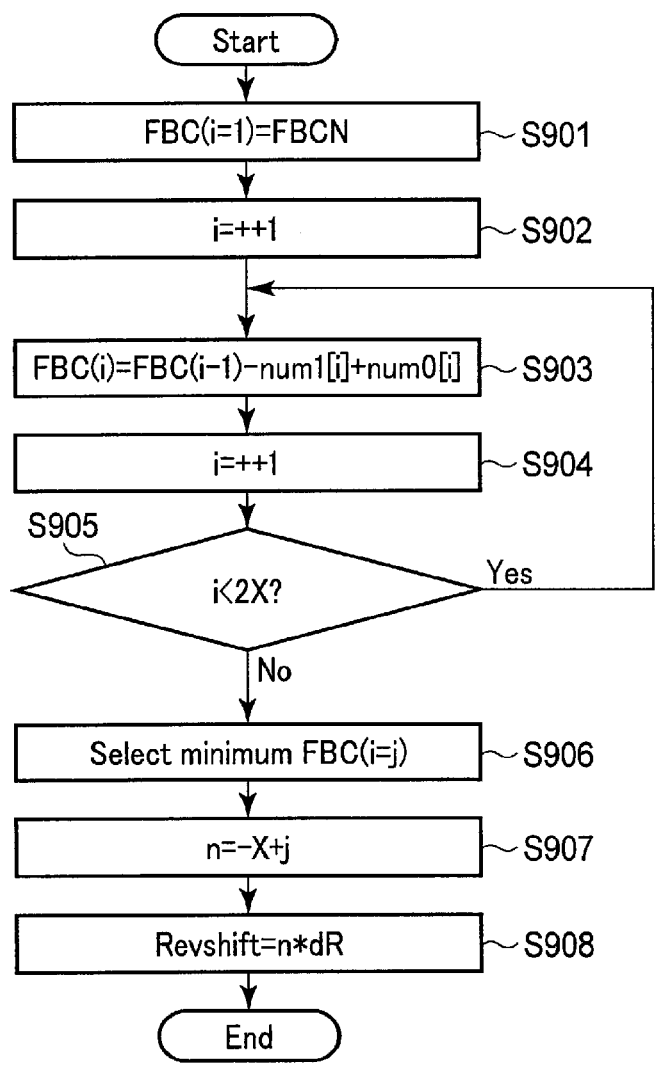
FIG. 34 is a flowchart illustrating a read operation according to a third embodiment.

Referring to FIG. 34, the operation example 1 is described.

[Step S901]

The CPU 230 derives an initial value FBCN (FBC(1)) of a fail bit number FBC(i) by using the channel matrix. The initial value FBCN is num0[0]+num1[1]+ . . . , num1[2X−1].

[Step S902]

The CPU 230 counts up a variable i by "1".

[Step S903]

The CPU 230 updates the fail bit number FBC(i) to FBC(i−1)−num1[i]+num0[i], based on the channel matrix.

[Step S904]

The CPU 230 counts up the variable i by "1".

[Step S905]

The CPU 230 determines whether the variable i is less than "2X" or not.

If the CPU 230 determines that the variable i is less than "2X" (step S905, Yes), the CPU 230 repeats step S903.

[Step S906]

If the CPU 230 determines that the variable i is not less than "2X" (step S905, No), the CPU 230 selects a fail bit number FBC(i=j) of a minimum value among the fail bit number FBC(1) to fail bit number FBC(2X −1).

[Step S907]

The CPU 230 updates the variable n to "−X+j".

[Step S908]

The CPU 230 sets the shift value Revshift (Revshift A or Revshift B) to "n×dR".

In the case of the first embodiment, this shift value Revshift is applied to step S106 of FIG. 12. In the case of the second embodiment, this shift value Revshift is applied to step S406 of FIG. 22 or step S606 of FIG. 24.

<3-1-2> Concrete Example 1

Next, referring to FIG. 35, a description is given of a concrete example 1 in a case of deriving the shift value Revshift relating to the first embodiment, or the shift value Revshift B relating to the first embodiment.

In the concrete example 1, a description is given based on the channel matrix illustrated in FIG. 14. In addition, in the concrete example 1, the value X in FIG. 34 is "4".

The CPU 230 derives the initial value FBCN (FBC(1)) by using the channel matrix (step S901). In this example, the initial value FBC(1) is "1759".

The CPU 230 increments the variable i by "1" (step S902), and updates the fail bit number FBC(2) to "FBC(1)−num1[2]+num0[2]" (step S903). As a result, the fail bit number FBC(2) becomes "953".

The CPU 230 increments the variable i by "1" (step S904), and updates the fail bit number FBC(3) to "FBC(2)−num1[3]+num0[3]" (step S903). As a result, the fail bit number FBC(3) becomes "497".

The CPU 230 increments the variable i by "1" (step S904), and updates the fail bit number FBC(4) to "FBC(3)−num1[4]+num0[4]" (step S903). As a result, the fail bit number FBC(4) becomes "300".

The CPU 230 increments the variable i by "1" (step S904), and updates the fail bit number FBC(5) to "FBC(4)−num1[5]+num0[5]" (step S903). As a result, the fail bit number FBC(5) becomes "231".

The CPU 230 increments the variable i by "1" (step S904), and updates the fail bit number FBC(6) to "FBC(5)−num1[6]+num0[6]" (step S903). As a result, the fail bit number FBC(6) becomes "639".

The CPU 230 increments the variable i by "1" (step S904), and updates the fail bit number FBC(7) to "FBC(6)−num1[7]+num0[7]" (step S903). As a result, the fail bit number FBC(7) becomes "2616".

The CPU 230 increments the variable i by "1" (step S904), and determines that the variable i is "2X (8)". Thus, the CPU 230 selects the minimum fail bit number FBC from among the obtained fail bit numbers FBC. Thus, the CPU 230 determines that the value "j" is "5" (step S906).

The CPU 230 updates the variable n to "+1" (step S907). As a result, the CPU 230 sets the shift value Revshift to "+1dR".

In this manner the CPU 230 can derive the shift value Revshift.

<3-1-3> Concrete Example 2

Next, referring to FIG. 36, a description is given of a concrete example 2 in a case of deriving the shift value Revshift A relating to the second embodiment.

In the concrete example 1, a description is given based on the channel matrix illustrated in FIG. 27. In addition, in the concrete example 2, the value X in FIG. 34 is "4".

The CPU 230 derives the initial value FBCN (FBC(1)) by using the channel matrix (step S901). In this example, the initial value FBC(1) is "1282".

The CPU 230 increments the variable i by "1" (step S902), and updates the fail bit number FBC(2) to "FBC(1)−num1[2]+num0[2]" (step S903). As a result, the fail bit number FBC(2) becomes "716".

The CPU 230 increments the variable i by "1" (step S904), and updates the fail bit number FBC(3) to "FBC(2)−num1[3]+num0[3]" (step S903). As a result, the fail bit number FBC(3) becomes "417".

The CPU 230 increments the variable i by "1" (step S904), and updates the fail bit number FBC(4) to "FBC(3)−num1[4]+num0[4]" (step S903). As a result, the fail bit number FBC(4) becomes "255".

The CPU 230 increments the variable i by "1" (step S904), and updates the fail bit number FBC(5) to "FBC(4)−num1[5]+num0[5]" (step S903). As a result, the fail bit number FBC(5) becomes "189".

The CPU 230 increments the variable i by "1" (step S904), and updates the fail bit number FBC(6) to "FBC(5)−num1[6]+num0[6]" (step S903). As a result, the fail bit number FBC(6) becomes "204".

The CPU 230 increments the variable i by "1" (step S904), and updates the fail bit number FBC(7) to "FBC(6)−num1[7]+num0[7]" (step S903). As a result, the fail bit number FBC(7) becomes "524".

The CPU 230 increments the variable i by "1" (step S904), and determines that the variable i is "2X (8)". Thus, the CPU 230 selects the minimum fail bit number FBC from among the obtained fail bit numbers FBC. In this example, "189" is the minimum fail bit number FBC. Thus, the CPU 230 determines that the value "j" is "5" (step S906).

The CPU 230 updates the variable n to "+1" (step S907). As a result, the CPU 230 sets the shift value Revshift A to "+1dR".

In this manner the CPU 230 can derive the shift value Revshift A.

<3-1-4> Operation Example 2

To begin with, an operation example 2 of the memory system according to this embodiment is described.

The operation example 2 is an example which can be substituted for step S607 of FIG. 24 described in the second embodiment.

Figure 37:
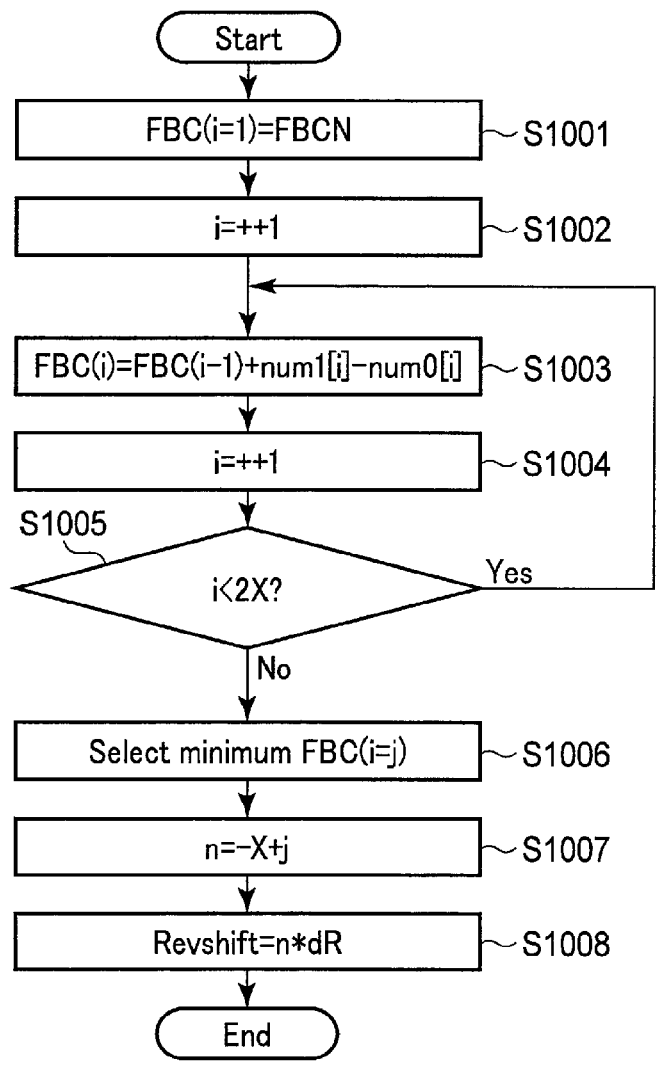
FIG. 37 is a flowchart illustrating a read operation according to a third embodiment.

Referring to FIG. 37, the operation example 2 is described.

[Step S1001] and [Step S1002]

The CPU 230 executes the same operations as steps S901 and S902.

[Step S1003]

Based on the channel matrix, the CPU 230 updates the fail bit number FBC(i) to "FBC(i−1)+num1[i]−num0[i]".

[Step S1004]~[Step S1008]

The CPU 230 executes the same operations as step S904 to step S908.

This shift value Revshift C is applied to step S608 of FIG. 24.

<3-1-5> Concrete Example 3

Next, referring to FIG. 38, a description is given of a concrete example 3 in a case of deriving the shift value Revshift C relating to the second embodiment.

In the concrete example 3, a description is given based on the channel matrix illustrated in FIG. 28. In addition, in the concrete example 3, the value X in FIG. 37 is "4".

The CPU 230 derives the initial value FBCN (FBC(1)) by using the channel matrix (step S1001). In this example, the initial value FBC(1) is "245".

The CPU 230 increments the variable i by "1" (step S1002), and updates the fail bit number FBC(2) to "FBC(1)+num1[2]−num0[2]" (step S1003). As a result, the fail bit number FBC(2) becomes "75".

The CPU 230 increments the variable i by "1" (step S1004), and updates the fail bit number FBC(3) to "FBC(2)+num1[3]−num0[3]" (step S1003). As a result, the fail bit number FBC(3) becomes "44".

The CPU 230 increments the variable i by "1" (step S1004), and updates the fail bit number FBC(4) to "FBC(3)+num1[4]−num0[4]" (step S1003). As a result, the fail bit number FBC(4) becomes "45".

The CPU 230 increments the variable i by "1" (step S1004), and updates the fail bit number FBC(5) to "FBC(4)+num1[5]−num0[5]" (step S1003). As a result, the fail bit number FBC(5) becomes "119".

The CPU 230 increments the variable i by "1" (step S1004), and updates the fail bit number FBC(6) to "FBC(5)+num1[6]−num0[6]" (step S1003). As a result, the fail bit number FBC(6) becomes "347".

The CPU 230 increments the variable i by "1" (step S1004), and updates the fail bit number FBC(7) to "FBC (6)+num1[7]−num0[7]" (step S1003). As a result, the fail bit number FBC(7) becomes "1256".

The CPU 230 increments the variable i by "1" (step S1004), and determines that the variable i is "2X (8)". Thus, the CPU 230 selects the minimum fail bit number FBC from among the obtained fail bit numbers FBC. In this example, "44" is the minimum fail bit number FBC. Thus, the CPU 230 determines that the value "j" is "3" (step S1006).

The CPU 230 updates the variable n to "−1" (step S1007).

As a result, the CPU 230 sets the shift value Revshift C to "−1dR".

In this manner the CPU 230 can derive the shift value Revshift C.

<3-2> Advantageous Effects

According to the above-described third embodiment, the memory system 1 derives the read level at which the fail bit number becomes minimum, by using the channel matrix.

In the above-described first and second embodiments, with respect to each of the read levels, the magnitudes of the first correct bit value (num1[i]) and the second correct bit value (num0[i]) are successively compared, thereby deriving the read level at which the large/small relationship between the first and second correct bit values is reversed. However, depending on threshold distributions, it is possible that the large/small relationship between the first and second correct bits is reversed a plurality of times. In the first and second embodiments, when the large/small relationship between the first and second correct bits is reversed a plurality of times, a proper read level cannot be derived.

However, in the above-described third embodiment, even when the large/small relationship between the first and second correct bits was reversed a plurality of times, a proper read level can be derived.

<4> Modifications, Etc.

A program, which realizes the process of each of the above-embodiments, may be provided by being stored in a computer-readable storage medium. The program is stored in the storage medium as a file of an installable format, or as a file of an executable format. The storage medium is, for instance, a magnetic disk, an optical disc (CD-ROM, CD-R, DVD, etc.), a magneto-optical disk (MO, etc.), a semiconductor memory, etc. The storage medium may be of any form if it can store a program and can be read by a computer. In addition, the program, which realizes the process of each of the above-embodiments, may be stored in a computer (server) connected to a network such as the Internet, and may be downloaded to a computer (client) via the network.

In each of the above embodiments, the case was described in which the control circuit 103 executes the SB read operation by shifting read voltages to the minus side and plus side, the number of the minus-side's read voltages and the number of the plus-side's read voltages are the same, from the voltage AR (n ("0" in this example)) that is used at the time of the HB read operation. This case is presented as an example only and other cases are applicable.

In each of the above embodiments, the case was described in which the memory cell transistor can store 1-bit data or 2-bit data. However, the restriction to this is unnecessary. Even in the case where the memory cell transistor stores data of 3 bits or more, the same advantageous effects can be obtained if the channel matrix is generated on a bit-by-bit basis.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
a memory configured to execute a first read and a second read for reading data from a semiconductor memory cell array;
a decoder configured to correct an error of the data read from the semiconductor memory cell array based on at least one of the first read and the second read, and output a first signal of a first value indicating corrected data and a second signal of a second value indicating corrected data;
a counter configured to count the first and the second signals for first data items, each of the first data items indicating read voltages of the first read and the second read; and
a controller configured to compare the counted numbers of the first and second signals in an order of the read voltages, determine, among the first data items, a first data item for which a magnitude relation between the counted numbers of the first and second signals changes, and determine a read voltage of the first read according to the determined first data item.

2. The system according to claim 1, wherein
the memory is configured to execute the second read for the semiconductor memory cell array in a case that the decoder fails to correct a second data which is read by the first read, and
the counter is configured to count, in a case that the decoder successfully corrects the second data and a third data which is read by the second read, the numbers of the first and second signals based on the second data, and the third data.

3. The system according to claim 1, wherein the semiconductor memory cell array is configured to use a plurality of read voltages in the second read.

4. The system according to claim 1, wherein the read levels for the first and second read are set in the semiconductor memory cell array.

5. The system according to claim 2, wherein the semiconductor memory cell array includes a plurality of pages,
each of the plurality of pages includes a plurality of memory cell transistors, and
the second data and the third data are stored in the same page.

6. The system according to claim 2, wherein the semiconductor memory cell array includes memory cell transistors connected to a plurality of word lines, and
the second data and the third data are stored in the memory cell transistors connected to the same word line.

7. The system according to claim 2, wherein the semiconductor memory cell array includes a plurality of blocks,
each of the plurality of blocks includes a plurality of memory cell transistors, and
the second data and the third data are stored in the same block.

8. The system according to claim 1, further comprising an encoder configured to encode data when the data is to be written in the semiconductor memory cell array.

9. The system according to claim 1, wherein the controller is configured to successively compare the magnitudes in an order from a low read voltage.

10. The system according to claim 1, wherein the first read is hard bit read, and
the second read is soft bit read.

11. A memory system comprising:
a memory configured to execute a first read and a second read for reading data from a semiconductor memory cell array; and
a controller configured to
correct an error of the data read from the semiconductor memory cell array based on at least one of the first read and the second read,
output a first signal of a first value indicating corrected data and a second signal of a second value indicating corrected data,
count the first and the second signals for first data items, each of the first data items indicating read voltages of the first read and the second read,
compare the counted numbers of the first and second signals in an order of the read voltages,
determine, among the first data items, a first data item for which a magnitude relation between the counted numbers of the first and second signals changes, and
determine a read voltage of the first read according to the determined first data item.

12. The system according to claim 11, wherein
the memory is configured to execute the second read for the semiconductor memory cell array, in a case that the controller fails to correct a second data which is read by the first read, and
the controller is configured to count, in a case that the controller successfully corrects the second data and a third data which is read by the second read, the numbers of the first and second signals based on the second data, and the third data.

13. The system according to claim 1, wherein the semiconductor memory cell array is configured to use a plurality of read voltages in the second read.

14. The system according to claim 11, wherein the read voltages for the first and second read are set in the semiconductor memory cell array.

15. The system according to claim 12, wherein the semiconductor memory cell array includes a plurality of pages,
each of the plurality of pages includes a plurality of memory cell transistors, and
the second data and the third data are stored in the same page.

16. The system according to claim 12, wherein the semiconductor memory cell array includes memory cell transistors connected to a plurality of word lines, and
the second data and the third data are stored in the memory cell transistors connected to the same word line.

17. The system according to claim 12, wherein the semiconductor memory cell array includes a plurality of blocks,
each of the plurality of blocks includes a plurality of memory cell transistors, and
the second data and the third data are stored in the same block.

18. The system according to claim 11, further comprising an encoder configured to encode data when the data is to be written in the semiconductor memory cell array.

19. The system according to claim 11, wherein the controller is configured to successively compare the magnitudes in an order from a low read voltage.

20. The system according to claim 11, wherein the first read is hard bit read, and
the second read is soft bit read.

* * * * *